(12) United States Patent
Kang et al.

(10) Patent No.: US 8,110,473 B2
(45) Date of Patent: Feb. 7, 2012

(54) SEMICONDUCTOR DEVICE COMPRISING MULTILAYER DIELECTRIC FILM AND RELATED METHOD

(75) Inventors: Sang-yeol Kang, Suwon-si (KR); Jong-cheol Lee, Seoul (KR); Ki-vin Lim, Seongnam-si (KR); Hoon-sang Choi, Seoul (KR); Eun-ae Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/635,013

(22) Filed: Dec. 10, 2009

(65) Prior Publication Data
US 2010/0255651 A1    Oct. 7, 2010

Related U.S. Application Data

(62) Division of application No. 12/034,868, filed on Feb. 21, 2008, now abandoned.

(30) Foreign Application Priority Data

Feb. 23, 2007    (KR) .................. 10-2007-0018409

(51) Int. Cl.
*H01L 21/02* (2006.01)
(52) U.S. Cl. .................................. 438/381
(58) Field of Classification Search .............. 257/532, 257/E21.008, E29.343; 438/98, 100, 584–688, 438/393
See application file for complete search history.

(56) References Cited

U.S. PATENT DOCUMENTS

| | | | | |
|---|---|---|---|---|
| 3,839,164 A | * | 10/1974 | Hurst | 205/86 |
| 6,150,209 A | * | 11/2000 | Sun et al. | 438/240 |
| 2003/0042526 A1 | * | 3/2003 | Weimer | 257/309 |
| 2005/0224913 A1 | | 10/2005 | Bhat et al. | |
| 2006/0051978 A1 | | 3/2006 | Li et al. | |
| 2006/0157741 A1 | * | 7/2006 | Jin | 257/213 |
| 2008/0002330 A1 | * | 1/2008 | Park | 361/311 |
| 2008/0099820 A1 | * | 5/2008 | Coppard et al. | 257/316 |

FOREIGN PATENT DOCUMENTS

JP    2002314072 A  * 10/2002
(Continued)

OTHER PUBLICATIONS

Ezhilvalavan et al. ("Short-Duration Rapid-Thermal-Annealing Processing of Tantalum Oxide Thin Films" Journal of the American Ceramic Society, vol. 82, Issue 3, Article first published online: Dec. 22, 2004, pp. 600-606).*

(Continued)

*Primary Examiner* — Marcos D. Pizarro
*Assistant Examiner* — Suian Tang
(74) *Attorney, Agent, or Firm* — Volentine & Whitt, PLLC

(57) ABSTRACT

A semiconductor device including a multilayer dielectric film and a method for fabricating the semiconductor device are disclosed. The multilayer dielectric film includes a type-one dielectric film having a tetragonal crystalline structure, wherein the type-one dielectric film comprises a first substance. The multilayer dielectric film also comprises a type-two dielectric film also having a tetragonal crystalline structure, wherein the type-two dielectric film comprises a second substance different from the first substance and a dielectric constant of the type-two dielectric film is greater than a dielectric constant of the type-one dielectric film.

12 Claims, 16 Drawing Sheets

FOREIGN PATENT DOCUMENTS

| | | |
|---|---|---|
| KR | 1020040070617 A | 8/2004 |
| KR | 1020050047471 A | 5/2005 |
| KR | 1020050074850 A | 7/2005 |
| KR | 1020060097299 A | 9/2006 |
| KR | 1020060097807 A | 9/2006 |
| KR | 1020070001454 A | 1/2007 |

OTHER PUBLICATIONS

"Physical and electrical characterization of Hafnium oxide and Hafnium silicate sputtered films" by Callegari et al. Journal of Applied Physics vol. 90, No. 12, Dec. 15, 2001.

* cited by examiner

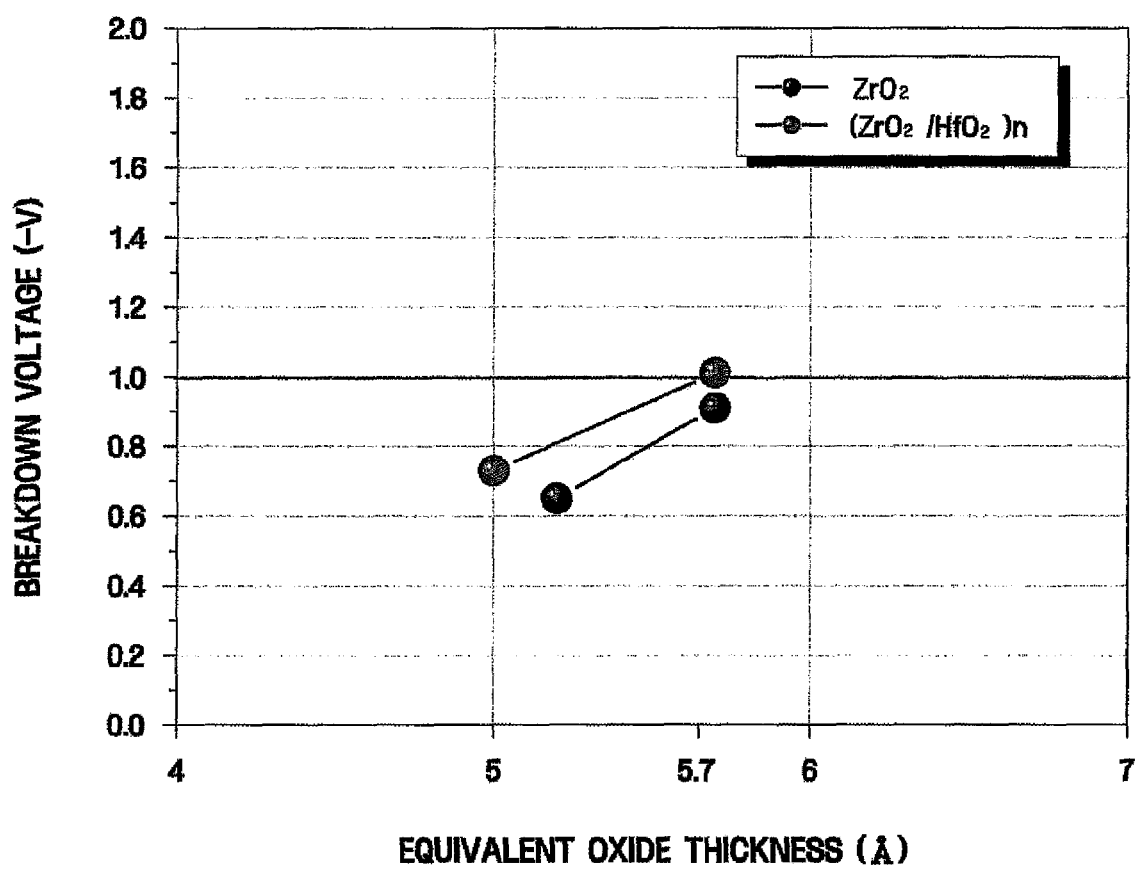

SEMICONDUCTOR DEVICE COMPRISING MULTILAYER DIELECTRIC FILM AND RELATED METHOD

CROSS-REFERENCE TO RELATED APPLICATIONS

This is a divisional of application Ser. No. 12/034,868 filed on Feb. 21, 2008, which claims priority to Korean Patent Application No. 10-2007-0018409, filed on Feb. 23, 2007. The subject matter of both of these applications is hereby incorporated by reference in their entirety.

BACKGROUND OF THE INVENTION

1. Field of the Invention

Embodiments of the invention relate to a semiconductor device and a method for fabricating the semiconductor device. In particular, embodiments of the invention relate to a semiconductor device comprising a multilayer dielectric film and a method for fabricating the semiconductor device.

2. Description of the Related Art

The degree of integration of semiconductor devices has increased in recent years. Accordingly, the respective amounts of chip area available for components of semiconductor devices have been reduced. A capacitor, which is used to store information in a DRAM device, is one such component, and capacitors that fit in the reduced area and that each have a capacitance that is the same as or greater than the capacitance of a capacitor fitting in a larger area are needed.

Thus, a dielectric film having a relatively high dielectric constant is desired in order to produce a capacitor including the dielectric film that has a desirable capacitance. Examples of dielectric films having relatively high dielectric constants include high-dielectric films such as zirconium oxide films ($ZrO_2$ layer), tantalum oxide layers ($Ta_2O_5$ layer), or hafnium oxide films ($HfO_2$ layer).

Even though a zirconium oxide single film has a relatively high dielectric constant in a crystalline state, a zirconium oxide single film will incur oxidation of a lower electrode due to diffusion of oxygen. Also, the heat generated during a subsequent process will reduce the dielectric constant and degrade the leakage current characteristics of a zirconium oxide single film. A tantalum oxide layer has a relatively high dielectric constant in a crystalline state; however, a high temperature heat treatment at a temperature of 700° C. or more needs to be performed on the tantalum oxide layer, and the high temperature heat treatment increases the leakage current of a capacitor including the tantalum oxide layer. Compared to a zirconium oxide film, hafnium oxide film is more resistant to diffusion of oxygen and has better heat resistance, but a hafnium oxide film in an amorphous state has a lower dielectric constant than a zirconium oxide film. A tetragonal system hafnium oxide has a higher dielectric constant than a zirconium oxide film; however, it is undesirable to use a hafnium oxide in a tetragonal system crystalline state to fabricate a dielectric film of a semiconductor device because it is difficult to shape a hafnium oxide in a tetragonal system crystalline state into a thin film.

SUMMARY OF THE INVENTION

Embodiments of the invention provide a semiconductor device comprising a multilayer dielectric film having a tetragonal crystalline structure, wherein the multilayer dielectric film has a relatively high dielectric constant, relatively low leakage current characteristics, and excellent heat resistance. Embodiments of the invention also provide a method for fabricating a semiconductor device comprising the multilayer dielectric film having a tetragonal crystalline structure.

In one embodiment, the invention provides a semiconductor device comprising a multilayer dielectric film disposed on a semiconductor substrate. The multilayer dielectric film comprises a first type-one dielectric film having a tetragonal crystalline structure, wherein the first type-one dielectric film comprises a first substance. The multilayer dielectric film also comprises a first type-two dielectric film also having a tetragonal crystalline structure, wherein the first type-two dielectric film comprises a second substance different from the first substance and a dielectric constant of the first type-two dielectric film is greater than a dielectric constant of the first type-one dielectric film.

In another embodiment, the invention provides a method for fabricating a semiconductor device comprising a multilayer dielectric film disposed on a semiconductor substrate. The method comprises forming a first type-one dielectric film on the semiconductor substrate, wherein the first type-one dielectric film comprises a first substance and has a tetragonal crystalline structure, and forming a preliminary first type-two dielectric film on the semiconductor substrate. The method further comprises heat treating the first type-one dielectric film and the preliminary first type-two dielectric film to form a first type-two dielectric film on the semiconductor substrate, wherein the first type-two dielectric film also has a tetragonal crystalline structure and comprises a second substance different from the first substance. In addition, the first type-two dielectric film has a greater dielectric constant than the first type-one dielectric film, and the multilayer dielectric film comprises the first type-one dielectric film and the first type-two dielectric film.

BRIEF DESCRIPTION OF THE DRAWINGS

Embodiments of the invention will be described herein with reference to the accompanying drawings, in which:

FIGS. 11A and 11B are graphs showing breakdown voltage (V) as a function of equivalent oxide thickness for a known zirconium oxide single film and a multilayer dielectric film in accordance with an embodiment of the invention.

DESCRIPTION OF EMBODIMENTS

Figure 1A:
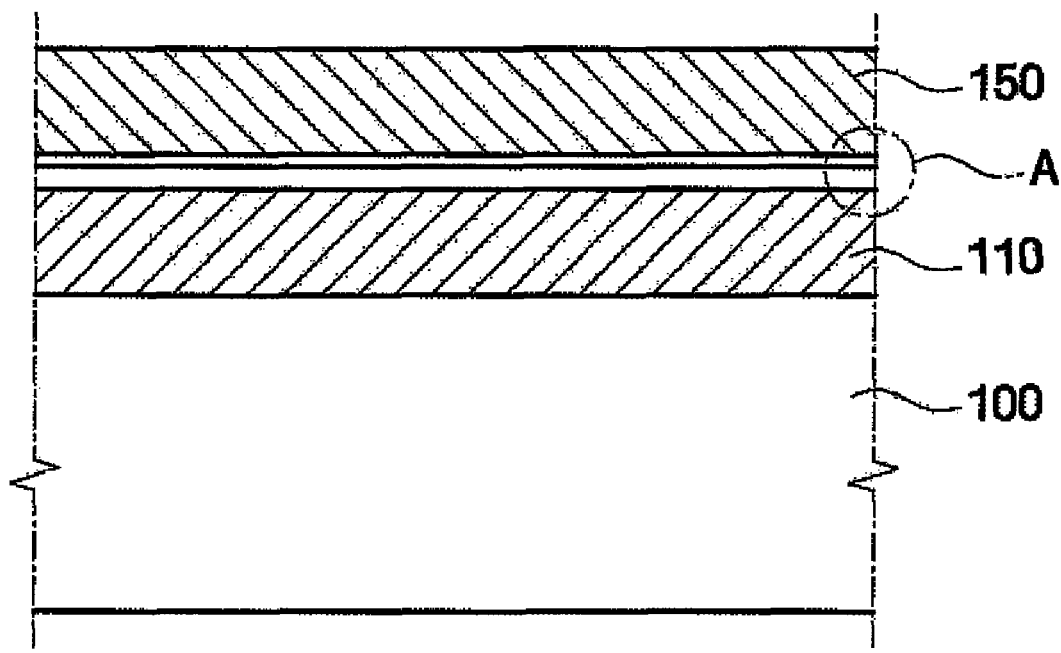
FIG. 1A is a cross-sectional view schematically illustrating a semiconductor device in accordance with an embodiment of the invention and FIG. 1B is a related blowup showing the cross-sectional view in some additional detail.
Figure 1B:
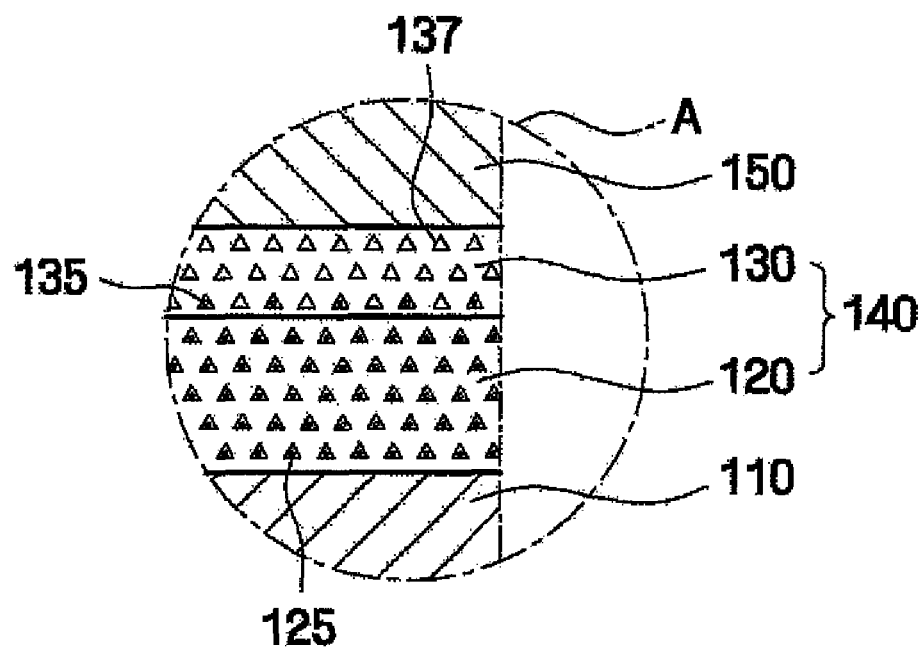
Figure 2A:
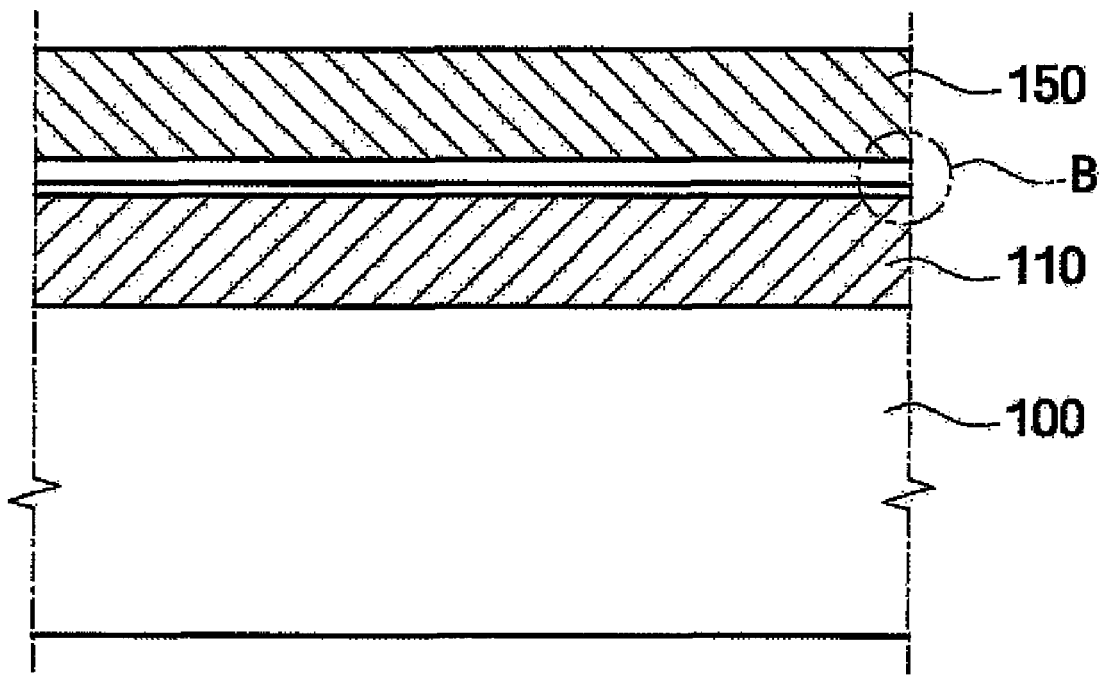
FIG. 2, inclusive of FIGS. 2A and 2B, FIG. 3, FIG. 4, FIG. 5, inclusive of FIGS. 5A and 5B, and FIG. 6, inclusive of FIGS. 6A and 6B, (FIGS. 2B, 5B, and 6B being respective blowups like FIG. 1B), are each cross-sectional views schematically illustrating semiconductor devices in accordance with other embodiments of the invention.
Figure 2B:
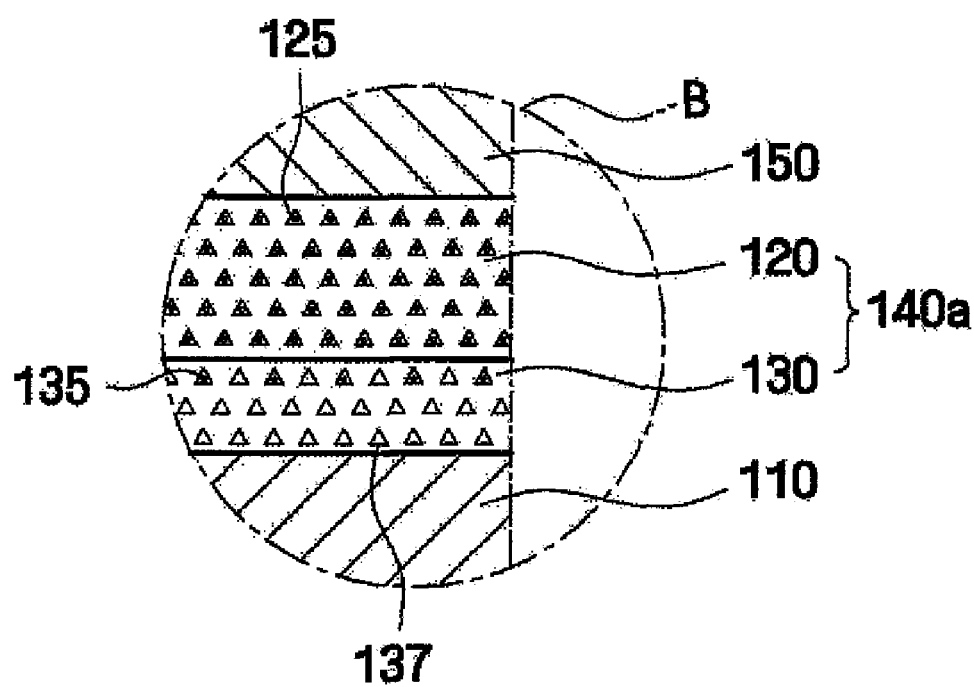

Embodiments of the invention will be described below. However, detailed description of known processes, structures, and techniques incorporated herein may be omitted.

The present invention will be described with reference to cross-sectional views in which embodiments of the invention are shown. However, actual semiconductor devices may differ from the embodiments illustrated in the drawings because of manufacturing techniques and/or allowances without departing from the scope of the invention as defined by the accompanying claims. In addition, the drawings are not necessarily drawn to scale.

As used herein, when a first element (e.g., a layer or film) is described as being "on" a second element (e.g., another layer, another film, or a semiconductor substrate), the first element may be directly on the second element or intervening elements (e.g., layers or films) may be present. Like reference symbols indicate like or similar elements throughout the specification.

Figure 7A:
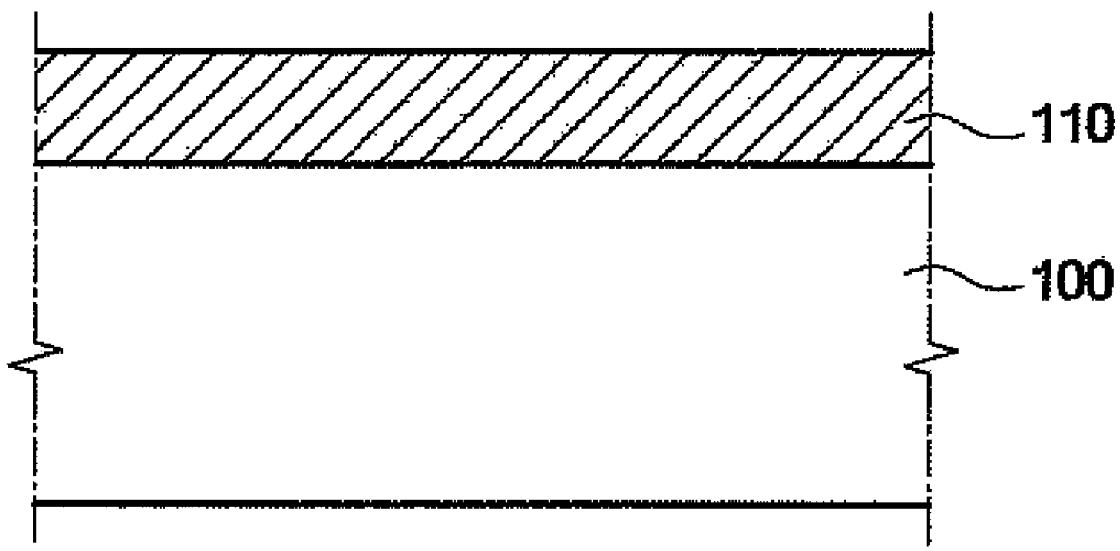
FIG. 7A, 7B, 7C—inclusive of FIGS. 7C-1 and 7C-2, and 7D—inclusive of FIGS. 7D-1 and 7D-2 are cross-sectional views illustrating a method in accordance with an embodiment of the invention for fabricating the semiconductor device of FIG. 1.
Figure 7B:
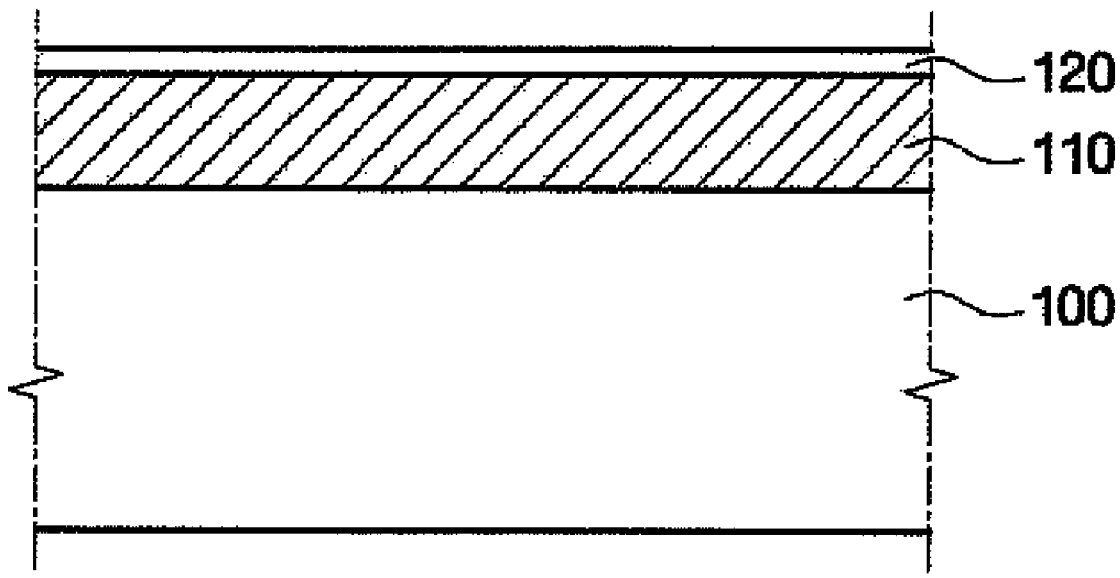
Figures 1, 7C:
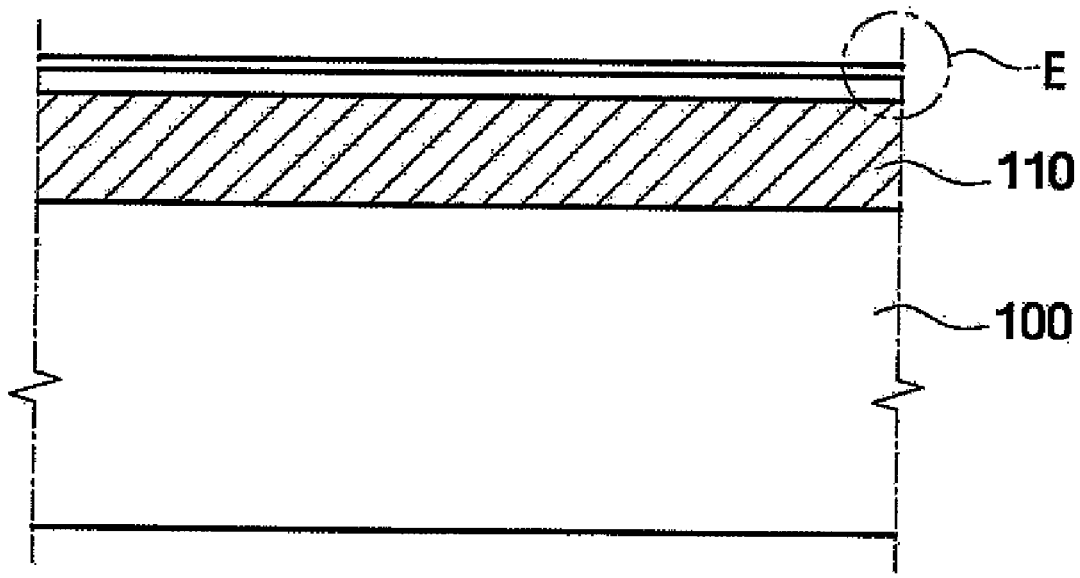

FIG. 1 is a cross-sectional view schematically illustrating a semiconductor device comprising a multilayer dielectric film in accordance with an embodiment of the invention. The semiconductor device of the embodiment illustrated in FIG. 1 comprises a MIM capacitor.

Referring to FIG. 1, a semiconductor device in accordance with an embodiment of the invention comprises a first electrode 110, a multilayer dielectric film 140, and a second electrode 150, each of which is disposed on a semiconductor substrate 100.

Semiconductor substrate 100 may be formed from at least one of, for example, Si, Ge, SiGe, GaP, GaAs, SiC, SiGeC, InAs, and InP. Although not illustrated in FIG. 1, semiconductor substrate 100 may comprise an element isolation film defining an activation area, source/drain areas, and a channel area.

As mentioned above, multilayer dielectric film 140 is disposed on semiconductor substrate 100. Multilayer dielectric film 140 comprises a type-one dielectric film 120 and a type-two dielectric film 130. In the embodiment illustrated in FIG. 1, type-two dielectric film 130 is disposed on type-one dielectric film 120. When fabricating the semiconductor device illustrated in FIG. 1, type-one dielectric film 120 is formed on (i.e., layered on) semiconductor substrate 100 and then type-two dielectric film 130 is formed on (i.e., layered on) type-one dielectric film 120. However, in another embodiment, type-one dielectric film 120 may be disposed on type-two dielectric film 130 (see FIG. 2), and accordingly, when the semiconductor device of that embodiment is formed, type-two dielectric film 130 may be formed on semiconductor substrate 100 and then type-one dielectric film 120 may be formed on type-two dielectric film 130.

Type-one dielectric film 120 and type-two dielectric film 130 are formed from different substances. For example, type-two dielectric film 130 may be formed from a substance having a greater dielectric constant than the substance from which type-one dielectric film 120 is formed. As an example satisfying the above-mentioned condition, type-one dielectric film 120 may be formed from a zirconium oxide film ($ZrO_2$) and type-two dielectric film 130 may be formed from a hafnium oxide film ($HfO_2$).

Type-one dielectric film 120 and type-two dielectric film 130 each have a tetragonal crystalline structure. The crystalline structure of a dielectric film relates to the magnitude of the dielectric constant of the dielectric film. That is, a dielectric film having a tetragonal crystalline structure (i.e., a tetragonal system structure) generally has a greater dielectric constant than a dielectric film having an amorphous structure or another type of crystalline structure. For example, the dielectric constant of a zirconium oxide film having an amorphous structure is about 20, but the dielectric constant of type-one dielectric film 120, which has a tetragonal crystalline structure and is formed from a zirconium oxide film, is about 40. Likewise, the dielectric constant of a hafnium oxide film having an amorphous structure is about 20, but the dielectric constant of type-two dielectric film 130, which has a tetragonal crystalline structure is formed from hafnium oxide film, may be about 40 to 70. Therefore, as described above, type-one dielectric film 120 and type-two dielectric film 130 each have a tetragonal crystalline structure, and accordingly, multilayer dielectric film 140, which comprises type-one dielectric film 120 and type-two dielectric film 130, may have a relatively high (i.e., a desirable) dielectric constant.

Moreover, multilayer dielectric film 140 comprising type-one dielectric film 120 and type-two dielectric film 130 each having a tetragonal crystalline structure may have relatively low leakage current characteristics and excellent heat resistance in addition to a relatively high dielectric constant. Multilayer dielectric film 140 has relatively low leakage current characteristics and excellent heat resistance because type-one dielectric film 120 and type-two dielectric film 130 each have a tetragonal crystalline structure. The leakage current characteristics and the heat resistance of multilayer dielectric film 140 may be controlled in accordance with the types of substances from which type-one dielectric film 120 and type-two dielectric film 130 are formed, respectively.

In the embodiment illustrated in FIG. 1, a tetragonal crystalline structure 125 of type-one dielectric film 120 and at least a portion of a tetragonal crystalline structure of type-two dielectric film 130 may form a continuous tetragonal crystalline structure. For example, tetragonal crystalline structure 125 of type-one dielectric film 120 and at least a tetragonal crystalline structure 135 of a first portion of type-two dielectric film 130 may form a continuous tetragonal crystalline structure. Tetragonal crystalline structure 125 of type-one dielectric film 120 and tetragonal crystalline structure 135 of the first portion of type-two dielectric film 130 forming a continuous tetragonal crystalline structure means that crystal grains of type-one dielectric film 120 and crystal grains of tetragonal crystalline structure 135 of the first portion of type-two dielectric film 130 constitute one tetragonal crystalline structure at a portion of multilayer dielectric film 140 proximate an interface between type-one dielectric film 120 and type-two dielectric film 130. In that case, distances between the crystal grains of type-one dielectric film 120 and crystal grains of type-two dielectric film 130 may be constant for at least a portion of multilayer dielectric film 140.

In some embodiments of the present invention, the thickness of type-one dielectric film 120 may be greater than the thickness of type-two dielectric film 130. For example, the thickness of type-one dielectric film 120 may be greater than the thickness of type-two dielectric film 130 by two times or more. In more detail, the thickness of type-one dielectric film 120 may be about 20 to 100 Å, and preferably about 40 to 70

Å. The thickness of type-two dielectric film 130 may be about 1 to 20 Å. The respective thicknesses of type-one dielectric film 120 and type-two dielectric film 130 may be controlled in consideration of the total thickness of multilayer dielectric film 140 and equivalent oxide thickness (Toxeq).

First electrode 110 and second electrode 150 are disposed on semiconductor substrate 100, and multilayer dielectric film 140 is interposed between first electrode 110 and second electrode 150. In the embodiment illustrated in FIG. 1, first electrode 110 is disposed under multilayer dielectric film 140, and second electrode 150 is disposed on multilayer dielectric film 140. Together, first electrode 110, second electrode 150, and multilayer dielectric film 140 may form a capacitor. The capacitor may be a cell capacitor of a DRAM device. Alternatively, the capacitor may be an MIM capacitor of a DRAM device.

First electrode 110 may be disposed directly on the surface of semiconductor substrate 100, or an interlayer insulating film (not shown) or other structures may be interposed between first electrode 110 and semiconductor substrate 100. The "other structures" mentioned above may include, for example, MOS transistors or bit lines.

Likewise, an interlayer insulating film (not shown), a passivation film (not shown), or a metal wiring line (not shown) may be formed on second electrode 150.

First electrode 110 and second electrode 150 may each be formed from a conductive substance such as, for example, metal. In more detail, first electrode 110 may be formed from at least one of a Ru film, an Ir film, a Pt film, a TiN film, a WN film, a TaN film, and a TiAlN film. In addition, second electrode 150 may be formed from at least one of a Ru film, an Ir film, a Pt film, a TiN film, a WN film, a TaN film, and a TiAlN film. However, first electrode 110 and second electrode 150 are not limited to being formed from at least one of the examples listed above.

Figures 2, 7C:
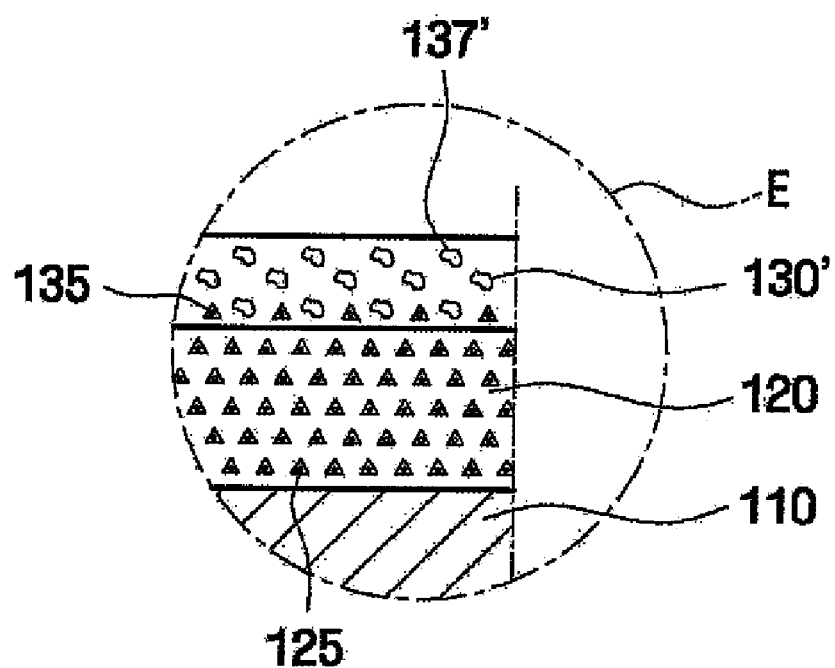

FIG. 2 is a cross-sectional view of a semiconductor device in accordance with another embodiment of the invention.

The semiconductor device in accordance with an embodiment of the invention illustrated in FIG. 2 has substantially the same structure as the semiconductor device of the embodiment illustrated in FIG. 1, except that type-one dielectric film 120 is disposed on type-two dielectric film 130 rather than type-two dielectric film 130 being disposed on type-one dielectric film 120. That is, when the semiconductor device of the embodiment illustrated in FIG. 2 is being formed, type-one dielectric film 120 and type-two dielectric film 130 are formed on semiconductor substrate 100 in a different order than when the semiconductor device of the embodiment illustrated in FIG. 1 is being formed. Type-one dielectric film 120 and type-two dielectric film 130 of the embodiment illustrated in FIG. 2 form a multilayer dielectric film 140a. Type-two dielectric film 130, which has a tetragonal crystalline structure, is disposed on first electrode 110, and first electrode 110 is disposed on semiconductor substrate 100. In addition, type-one dielectric film 120, which has a tetragonal crystalline structure, is disposed on type-two dielectric film 130. As described with reference to FIG. 1, type-one dielectric film 120 may be formed from a zirconium oxide film and type-two dielectric film 130 may be formed from a hafnium oxide film. In addition, tetragonal crystalline structure 125 of type-one dielectric film 120 and a tetragonal crystalline structure of at least a portion of type-two dielectric film 130 may form a continuous tetragonal crystalline structure. For example, tetragonal crystalline structure 125 of type-one dielectric film 120 and tetragonal crystalline structure 135 of a first portion of type-two dielectric film 130 may form a continuous tetragonal crystalline structure. Thus, in view of the embodiments described with reference to FIGS. 1 and 2, the tetragonal crystalline structure of type-one dielectric film 120 and at least a portion of the tetragonal crystalline structure of type-two dielectric film 130 may form a continuous tetragonal crystalline structure regardless of the order in which type-one dielectric film 120 and type-two dielectric film 130 are disposed on semiconductor substrate 100.

The semiconductor device in accordance with an embodiment of the invention illustrated in FIG. 1 comprises a multilayer dielectric film 140. In addition, the semiconductor device in accordance with an embodiment of the invention illustrated in FIG. 2 comprises a multilayer dielectric film 140a. Multilayer dielectric films 140 and 140a each have a two-layer structure comprising a type-one dielectric film 120 having a tetragonal crystalline structure and a type-two dielectric film 130 having a tetragonal crystalline structure.

Embodiments of a semiconductor memory device comprising a multilayer dielectric film having three or more layers will now be described. In describing the embodiments illustrated in FIGS. 3 to 6, descriptions of elements described previously with regard to the embodiments illustrated in FIGS. 1 and 2 may be omitted or those elements may be described briefly. FIGS. 3 to 6 are cross-sectional views schematically illustrating semiconductor devices in accordance with other embodiments of the invention.

Figure 3:
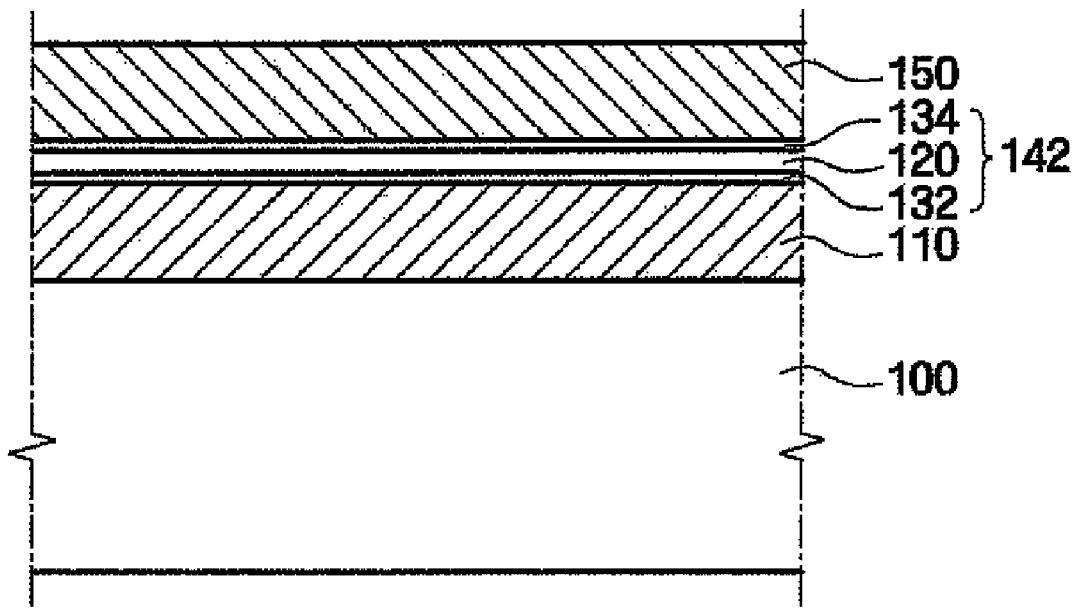
Figure 4:
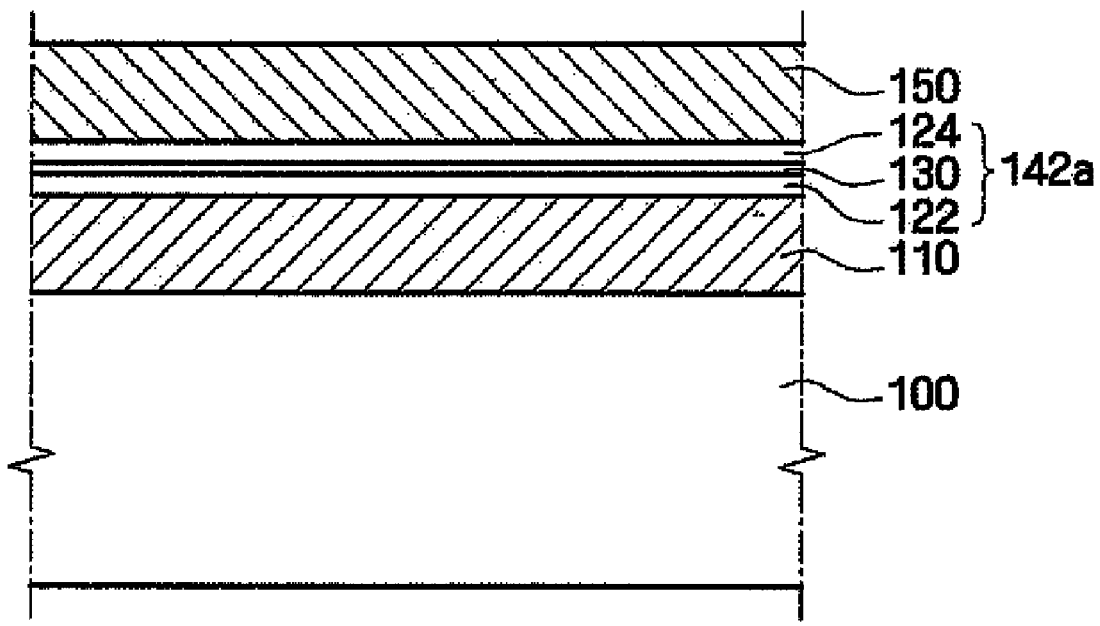

Each of the semiconductor devices illustrated in FIGS. 3 and 4 comprises a multilayer dielectric film having a three-layer structure. The embodiments illustrated in FIGS. 3 and 4 will now be described.

Referring to FIG. 3, a multilayer dielectric film 142 in accordance with an embodiment of the invention comprises a type-two dielectric film 132, a type-one dielectric film 120, and a type-two dielectric film 134, which are sequentially layered on first electrode 110. In this case, type-one dielectric film 120 may be formed from a zirconium oxide film and each of type-two dielectric films 132 and 134 may be formed from a hafnium oxide film. That is, in the embodiment illustrated in FIG. 3, multilayer dielectric film 142 has a three-layer structure comprising type-two dielectric film 132, type-one dielectric film 120, and type-two dielectric film 134. The thickness of type-one dielectric film 120 of multilayer dielectric film 142 (i.e., of the three-layer structure) may be smaller than the thickness of type-one dielectric film 120 of either of multilayer dielectric films 140 and 140a (i.e., either of the two-layer structures) of the embodiments illustrated in FIGS. 1 and 2, respectively. For example, the thickness of type-one dielectric film 120 of the embodiment illustrated in FIG. 3 may be in a range of about 20 to 60 Å. Type-two dielectric films 132 and 134 may have the same thickness regardless of whether they are part of a two-layer or a three-layer structure. For example, type-two dielectric films 132 and 134 of the embodiment illustrated in FIG. 3 may each have a thickness of about 1 to 20 Å, which is similar to the thickness of type-two dielectric film 130 of the embodiments illustrated in FIGS. 1 and 2.

Like the type-one and type-two dielectric films of the embodiments illustrated in FIGS. 1 and 2, type-one dielectric film 120 and type-two dielectric films 132 and 134 of the embodiment illustrated in FIG. 3 each have a tetragonal crystalline structure. Multilayer dielectric film 142, which has a three-layer tetragonal crystalline structure, may be denser, have a higher dielectric constant, have lower leakage current characteristics, and have better heat resistance than a zirconium oxide single film having a tetragonal crystalline structure or a multilayer dielectric film having a different crystalline structure.

Referring to FIG. 4, a semiconductor device in accordance with an embodiment of the invention comprises a multilayer dielectric film 142a comprising a type-one dielectric film 122, a type-two dielectric film 130, and a type-one dielectric film 124 disposed first electrode 110. Type-two dielectric film 130 is disposed on type-one dielectric film 122, and type-one dielectric film 124 is disposed on type-two dielectric film 130. In the embodiment illustrated in FIG. 4, similar to the embodiment illustrated in FIG. 3, type-two dielectric film 130 may be formed from a hafnium oxide film and each of type-one dielectric films 122 and 124 may be formed from a zirconium oxide film. Unlike the embodiment illustrated in FIG. 3, multilayer dielectric film 142a of the embodiment illustrated in FIG. 4 comprises two type-one dielectric films 122 and 124 and one type-two dielectric film 130. Type-one dielectric films 122 and 124 may have a thickness of about 20 to 60 Å. Type-one dielectric film 122 and type-one dielectric film 124 may have substantially the same thickness. Furthermore, the thickness of type-two dielectric film 130 may be in a range of about 1 to 20 Å.

In the embodiment illustrated in FIG. 4, type-one dielectric films 122 and 124 and type-two dielectric film 130 each have a tetragonal crystalline structure. Additionally, multilayer dielectric film 142a having a three-layer structure in accordance with an embodiment of the invention may be denser, have a higher dielectric constant, have lower leakage current characteristics, and have better heat resistance than a zirconium oxide single film having a tetragonal crystalline structure or a multilayer dielectric film having another crystalline structure.

Figure 5A:
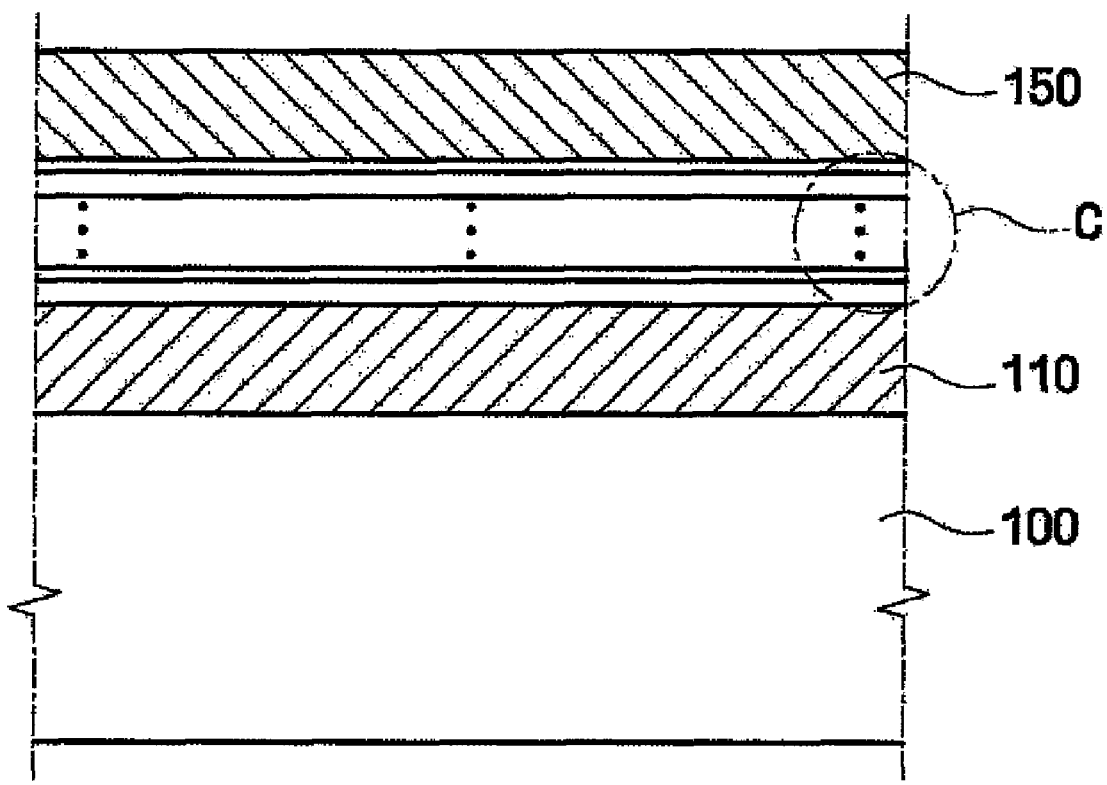
Figure 5B:
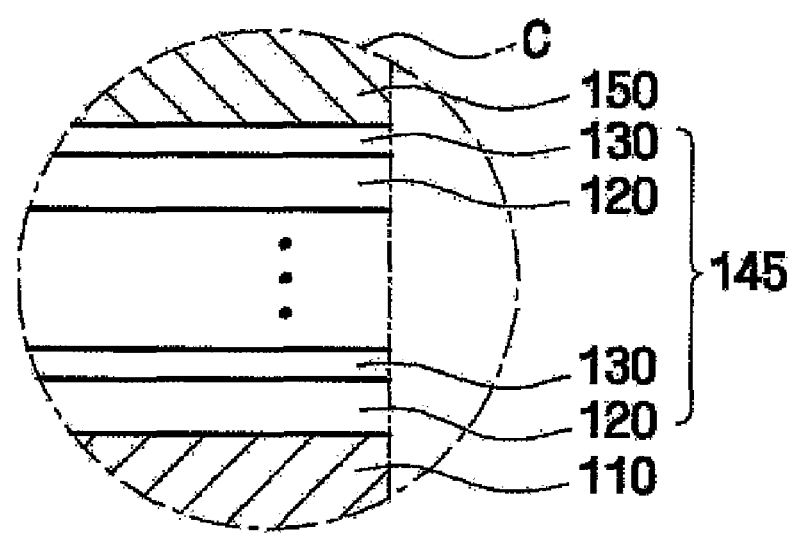
Figure 6A:
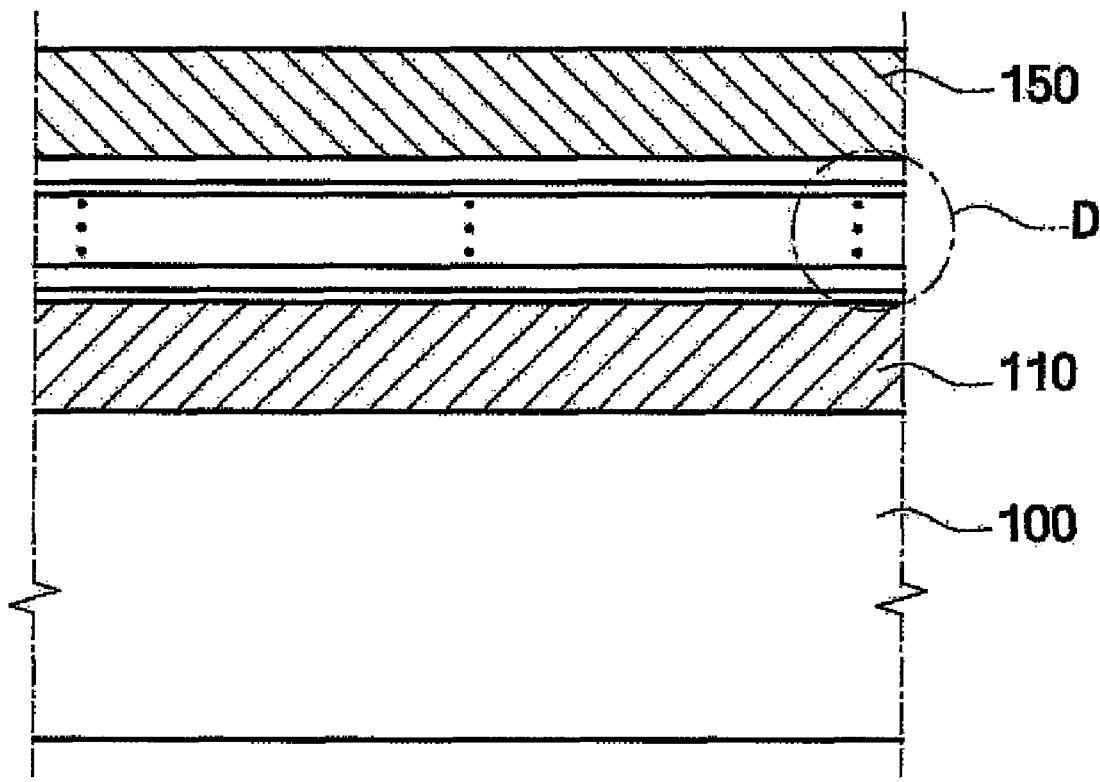
Figure 6B:
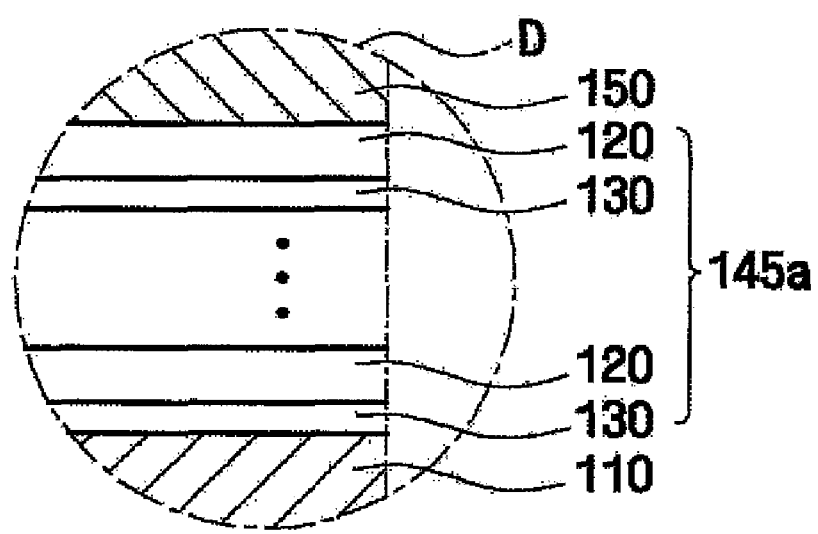

The multilayer dielectric layer of the embodiment illustrated in FIG. 5 and the multilayer dielectric layer of the embodiment illustrated in FIG. 6 each comprise a plurality of type-one dielectric films and a plurality of type-two dielectric films, wherein the type-one dielectric films and the type-two dielectric films are disposed alternately on a semiconductor substrate.

Referring to FIG. 5, a multilayer dielectric film 145 in accordance with another embodiment of the invention comprises a plurality of type-one dielectric films 120 and a plurality of type-two dielectric films 130, wherein the type-one dielectric films 120 and the type-two dielectric films 130 are disposed alternately on first electrode 110. In the embodiment illustrated in FIG. 5, each type-one dielectric film 120 may be formed from a zirconium oxide film and each type-two dielectric film 130 may be formed from a hafnium oxide film. In order to maintain a constant thickness for multilayer dielectric film 145 across embodiments of the invention in which the multilayer dielectric film comprises different numbers of layers, the respective thicknesses of type-one dielectric films 120 and type-two dielectric films 130 of the embodiment illustrated in FIG. 5 may be reduced as the total number type-one dielectric films 120 and type-two dielectric films 130 increases. Therefore, the thickness of each type-one dielectric film 120 of the embodiment illustrated in FIG. 5 may be smaller than the respective thicknesses of type-one dielectric films 120 of the embodiments illustrated in FIGS. 1 and 2. Likewise, the thickness of each type-two dielectric film 130 of the embodiment illustrated in FIG. 5 may be smaller than the respective thicknesses of type-two dielectric films 130 of the embodiments illustrated in FIGS. 1 and 2. In more detail, the embodiment illustrated in FIG. 5, the thickness of each type-one dielectric film 120 may be in a range of about 2 to 20 Å, and the thickness of each of the hafnium oxide films from which a type-two dielectric film 130 is formed may be in a range of about 1 to 10 Å.

In the embodiment illustrated in FIG. 5, each of type-one dielectric films 120 and type-two dielectric films 130 has a tetragonal crystalline structure. In addition, similar to adjacent dielectric films of the embodiments illustrated in FIGS. 1 and 2, for each pair of adjacent dielectric films in the embodiment illustrated in FIG. 5, at least a portion of the tetragonal crystalline structure of a first dielectric film of the pair and at least a portion of the tetragonal crystalline structure of a second dielectric film of the pair may form a continuous tetragonal crystalline structure proximate an interface between the first and second dielectric films of the pair. Multilayer dielectric film 145 in accordance with an embodiment of the invention may be denser, have a higher dielectric constant, have lower leakage current characteristics, and have better heat resistance than a zirconium oxide single film having a tetragonal crystalline structure or a multilayer dielectric film having another crystalline structure. In addition, second electrode 150 is disposed on multilayer dielectric film 145, and together first electrode 110, multilayer dielectric film 145, and second electrode 150 may form a capacitor.

The embodiment illustrated in FIG. 6 is substantially the same as the embodiment illustrated in FIG. 5, except that the order in which type-one dielectric films 120 and type-two dielectric films 130 are disposed on semiconductor substrate 100 is different.

An exemplary method of fabricating a semiconductor device comprising a multilayer dielectric film having a tetragonal crystalline structure will now be described.

FIGS. 7A to 7D are cross-sectional views illustrating a method for fabricating the semiconductor device illustrated in FIG. 1 in accordance with an embodiment of the invention. FIGS. 7A to 7D show intermediate structures produced when performing the method.

Referring to FIG. 7A, first electrode 110 is formed on semiconductor substrate 100. Semiconductor substrate 100 may include elements such as transistors, bit lines, and storage node contacts, which may be formed through corresponding fabrication processes. At least one of a Ru film, an Ir film, a Pt film, a TiN film, a WN film, a TaN film, a TiAlN film, may be selectively formed on an upper side of semiconductor substrate 100 as a conductive film for first electrodes. The conductive film for first electrodes may be fabricated by using, for example, an atomic layer deposition (ALD) process, a physical vapor deposition (PVD) process, or a chemical vapor deposition (CVD) process. Subsequently, the conductive film for first electrodes is patterned to form first electrode 110. In the embodiment illustrated in FIGS. 1 and 7A to 7D, first electrode 110 has a plate shape. However, the shape of first electrode 100 is not limited to a plate shape. Rather, the first electrode may have a three-dimensional structure and have the shape of, for example, a cylinder. Since a process for forming first electrode 110 is well known in the art, detailed description thereof will be omitted here.

Next, referring to FIGS. 7B and 7C, type-one dielectric film 120 and a preliminary type-two dielectric film 130' are formed on an upper side of first electrode 110. Type-one dielectric film 120 and preliminary type-two dielectric film 130' are formed from different substances. An embodiment of the invention in which type-one dielectric film 120 is formed from a zirconium oxide film and preliminary type-two dielectric film 130' is formed from a hafnium oxide film will be described herein with reference to FIGS. 7A to 7D.

First, type-one dielectric film 120 is formed on first electrode 110 using, for example, an atomic layer deposition (ALD) process. An ALD process is advantageous because it provides excellent step coverage, it forms a film more densely than other deposition processes, and a zirconium oxide film having a tetragonal crystalline structure may be formed through an ALD process.

As an example, the formation of type-one dielectric film 120 using the atomic layer deposition process may be performed through the following procedure. Type-one dielectric film 120 may be formed by repeatedly performing process cycles, wherein each process cycle comprises providing a zirconium source substance, providing purge gas, providing reactive gas, and providing additional purge gas.

In more detail, TEMAZ (tetrakis-methylethylamino-zirconium; $Zr(N(CH_3)(C_2H_5))_4$) or TDEAZ (tetrakis-diethylamino-zirconium; $Zr(N(C_2H_5)_2)_4$), for example, may be provided into a reaction chamber as the zirconium source substance at a reaction temperature of about 200 to 400° C. $N_2$ or Ar gas is then provided as the purge gas to purge the source substance. Subsequently, the reactive gas is provided, and, for example, $H_2O$, $O_3$, O radicals, alcohol (e.g., isopropyl alcohol), $D_2O$, $H_2O_2$, $O_2$, $N_2O$, or NO may be used as the reactive gas. Next, a purge gas such as Ar gas is provided to remove an unreacted substance. The procedure described above is performed repeatedly to form type-one dielectric film 120 having a thickness of about 20 to 100 Å, and preferably about 40 to 70 Å. Type-one dielectric film 120 formed as described above has a tetragonal crystalline structure 125. In addition, type-one dielectric film 120 having tetragonal crystalline structure 125 has dielectric constant of about 40.

Subsequently, a preliminary type-two dielectric film 130' is formed on an upper side of type-one dielectric film 120. In more detail, TEMAH (tetrakis-ethylmethylamino-hafnium), for example, may be used as the source substance, and $O_2$ or $O_3$, for example, may be used as the reactive gas to perform the same atomic layer deposition process used for the formation of type-one dielectric film 120. That is, the same atomic layer deposition process may be used to form type-one dielectric film 120 and preliminary type-two dielectric film 130'. However, at least one substance and/or gas used in the atomic layer deposition process when forming preliminary type-two dielectric film 130' may be different than when using the atomic layer deposition process to form type-one dielectric film 120. Through the atomic layer deposition process, preliminary type-two dielectric film 130' may be formed to have a thickness of about 1 to 20 Å. Preliminary type-two dielectric film 130' is formed from a hafnium oxide film, but not all of preliminary type-two dielectric film 130' is formed to have a tetragonal crystalline structure using the atomic layer deposition process. At least a portion of preliminary type-two dielectric film 130' grows from the tetragonal crystalline structure of type-one dielectric film 120. In the embodiment illustrated in FIGS. 7A to 7D, a tetragonal crystalline structure 135 forming a first portion of preliminary type-two dielectric film 130' grows from the tetragonal crystalline structure of type-one dielectric film 120. Tetragonal crystalline structure 125 of type-one dielectric film 120 acts as a seed layer to tetragonal crystalline structure 135 of preliminary type-two dielectric film 130'. However, the majority of preliminary type-two dielectric film 130' is an amorphous portion (i.e., a second portion) formed having an amorphous state 137'. The first portion of preliminary type-two dielectric film 130' having tetragonal crystalline structure 135 is formed proximate an interface between type-one dielectric film 120 and preliminary type-two dielectric film 130'. That is, the first portion of preliminary type-two dielectric film 130' having tetragonal crystalline structure 135 is formed proximate a lower side of preliminary type-two dielectric film 130'.

Figures 1, 7D:
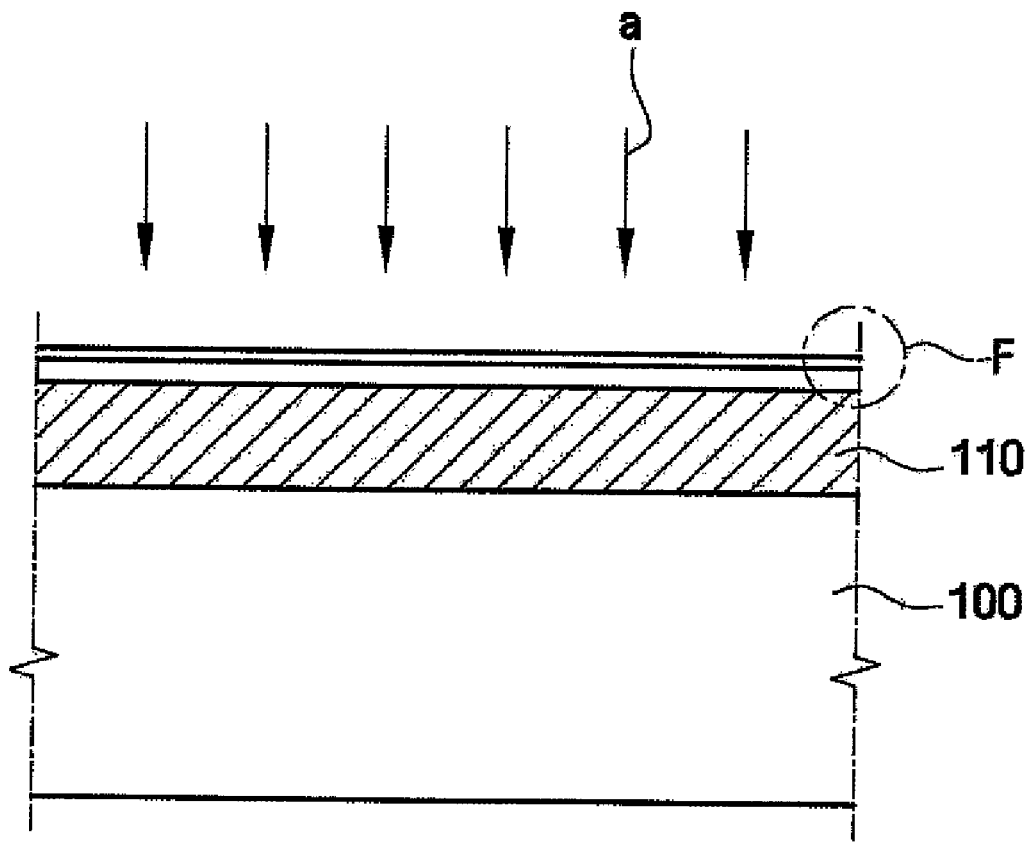
Figures 2, 7D:
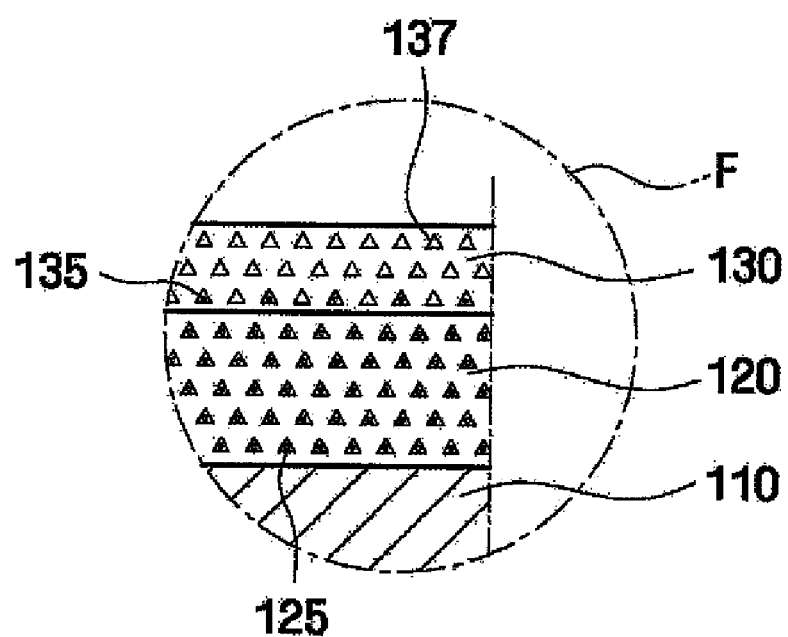

Referring to FIG. 7D, the structure illustrated in FIG. 7C is subjected to a heat treatment A so that the amorphous portion of preliminary type-two dielectric film 130' is crystallized to give the amorphous portion a tetragonal crystalline structure 137. Heat treatment A may be performed using a rapid thermal annealing (RTA) process performed in an atmosphere of at least one of Ar and $O_2$ at a temperature of about 300 to 700° C., and preferably at a temperature of about 400 to 700° C., for about 30 sec to 5 min. Alternatively, heat treatment A may be performed using a plasma heat treatment process that is performed at a temperature of about 25 to 400° C. for about 5 to 60 min, or using a vacuum heat treatment process performed at a temperature of about 300 to 700° C. Heat treatment A may be performed immediately after preliminary type-two dielectric film 130' is formed, as described with reference to the embodiment illustrated in FIGS. 7A to 7D. Alternatively, heat treatment A may be performed after a second electrode 150 (see FIG. 1) is formed. Thus, there are various stages in a method for forming the semiconductor device illustrated in FIG. 1 at which heat treatment A may be performed. Formation of a second electrode will be described below.

As a result of heat treatment A, a tetragonal crystalline structure grows in at least a portion of the amorphous portion of preliminary type-two dielectric film 130' from tetragonal crystalline structure 125 of type-one dielectric film 120 and/or tetragonal crystalline structure 135 of preliminary type-two dielectric film 130' acting as a seed layer until crystallization of preliminary type-two dielectric film 130' to a desirable tetragonal crystalline structure is completed. Thus, type-two dielectric film 130 having tetragonal crystalline structures 135 and 137 is formed. That is, type-two dielectric film 130 is formed from preliminary type-two dielectric film 130'.

In the method described above, when preliminary type-two dielectric film 130' is formed, a tetragonal crystalline structure 135 grows (as a portion of preliminary type-two dielectric film 130') from tetragonal crystalline structure 125 of type-one dielectric film 120 acting as a seed layer, and the remaining portion of preliminary type-two dielectric film 130' is amorphous (i.e., has an amorphous state 137'). Then, during a subsequent heat treatment process (i.e., heat treatment A), tetragonal crystalline structure 137 grows from tetragonal crystalline structure 125 of type-one dielectric film 120 and/or tetragonal crystalline structure 135 of preliminary type-two dielectric film 130', which act as a seed layer. Therefore, in the embodiment illustrated in FIGS. 7A to 7D, the tetragonal crystalline structure of type-two dielectric film 130 may form a continuous tetragonal crystalline structure with the tetragonal crystalline structure of type-one dielectric film 120. Type-two dielectric film 130 having a tetragonal crystalline structure (i.e., tetragonal crystalline structures 135 and 137) may have a dielectric constant of about 40 to 70.

In addition, as a result of heat treatment A and the crystallization of type-two dielectric film 130, the structure of type-one dielectric film 120 may become denser, and crystallization type-one dielectric film 120 may be increased.

Referring to FIG. 1, second electrode 150 is formed on upper sides of type-one dielectric film 120 having tetragonal crystalline structure 125 and type-two dielectric film 130 having tetragonal crystalline structures 135 and 137. Like the conductive film for first electrodes, a conductive film for second electrodes may be formed from, for example, at least one of a Ru film, an Ir film, a Pt film, a TiN film, a WN film, a TaN film, and a TiAlN film. The conductive film for second electrodes may be fabricated using, for example, an atomic layer deposition (ALD) process, a physical vapor deposition (PVD) process, or a chemical vapor deposition (CVD) process. Subsequently, the conductive film for second electrodes is patterned to form second electrode 150, thereby finishing the fabrication of a capacitor comprising first electrode 110, multilayer dielectric layer 140, and second electrode 150.

Although not illustrated, a method for fabricating the semiconductor device illustrated in FIG. 2 comprises forming a preliminary type-two dielectric film on first electrode 110 and forming type-one dielectric film 120 on preliminary type-two dielectric film 130'. Forming preliminary type-two dielectric film 130' and type-one dielectric film 120 of the embodiment illustrated in FIG. 2 is substantially the same as forming preliminary type-two dielectric film 130' and type-one dielectric film 120 of the embodiment illustrated in FIG. 1 as described with reference to FIGS. 7A to 7C, except that, for the embodiment illustrated in FIG. 2, the dielectric films are formed on first electrode 110 in a different order. However, since type-one dielectric film 120 is formed after the preliminary type-two dielectric film is formed, and a separate seed layer for tetragonal crystalline structures is not used during the formation of preliminary type-two dielectric film 130', the preliminary type-two dielectric film mainly comprises an amorphous portion, not a tetragonal crystalline structure. Type-one dielectric film 120 comprises a zirconium oxide film and is formed to have a tetragonal crystalline structure using an atomic layer deposition process, and the tetragonal crystalline structure of type-one dielectric film 120 is used as a seed layer to crystallize preliminary type-two dielectric film 130' so that an upper portion of preliminary type-two dielectric film 130' has a tetragonal crystalline structure. Subsequently, in a manner analogous to the manner shown in FIG. 7D (although type-one dielectric film 120 is formed on type-two dielectric film 130 when fabricating the semiconductor device of the embodiment illustrated in FIG. 2), when the resulting structure is subjected to heat treatment A, the remaining amorphous area of the preliminary type-two dielectric film is crystallized to form type-two dielectric film 130 having a tetragonal crystalline structure. Other processes performed when fabricating the semiconductor device of the embodiment illustrated in FIG. 2 may be readily inferred from the processes described with reference to FIGS. 7A to 7D, so detailed description thereof will be omitted here.

FIGS. 8A to 8D are cross-sectional views illustrating a method for forming the semiconductor device illustrated in FIG. 3 in accordance with an embodiment of the invention. The semiconductor device illustrated in FIG. 3 comprises a multilayer dielectric film having a three-layer structure. Processes in the method illustrated in FIGS. 8A to 8D are substantially the same as those of the method illustrated in FIGS. 7A to 7D up to and including the formation of first electrode 110. Description of fabrication processes that are the same as fabrication processes previously described with reference to FIGS. 7A to 7D will be omitted with regard to the method illustrated in FIGS. 8A to 8D, or such processes will the described only briefly with regard to FIGS. 8A to 8D.

Figure 8A:
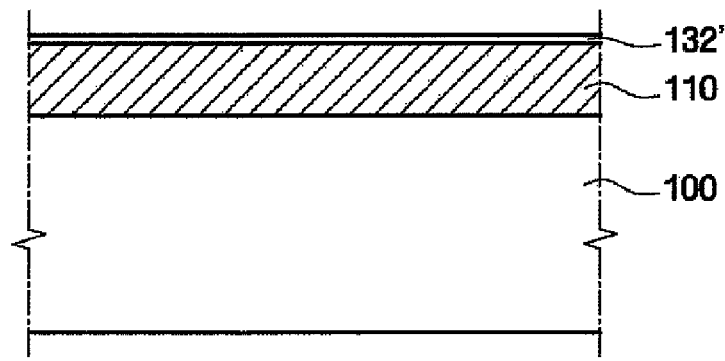
FIGS. 8A, 8B, 8C and 8D are cross-sectional views illustrating a method in accordance with an embodiment of the invention for fabricating the semiconductor device of FIG. 3.
Figure 8B:
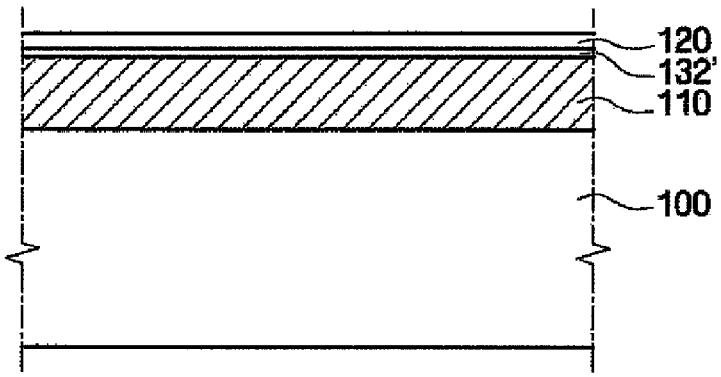
Figure 8C:
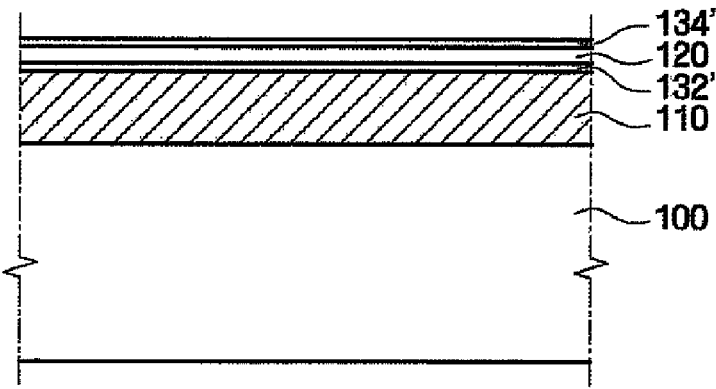

Referring to FIGS. 8A to 8C, a preliminary type-two dielectric film 132', a type-one dielectric film 120, and a preliminary type-two dielectric film 134' are sequentially formed on an upper side of first electrode 110. An embodiment of the invention in which type-one dielectric film 120 is formed from a zirconium oxide film and preliminary type-two dielectric films 132' and 134' are formed from hafnium oxide films will be described herein with reference to FIGS. 8A to 8D.

Preliminary type-two dielectric film 132' is formed on first electrode 110 and type-one dielectric film 120 is formed on preliminary type-two dielectric film 132'. Subsequently, preliminary type-two dielectric film 134' is formed on type-one dielectric film 120. Dielectric films 132', 120, and 134' are formed using the same atomic layer deposition process used to form dielectric films 120 and 130' as described above with reference to FIGS. 7B to 7C. However, at least one substance and/or gas used in the atomic layer deposition process when forming a preliminary type-two dielectric film 132' or 134' may be different than when using the atomic layer deposition process to form type-one dielectric film 120. In the three-layer structure formed by dielectric films 132', 120, and 134', the thickness of type-one dielectric film 120 may be smaller than the thickness of type-one dielectric film 120 of the semiconductor device illustrated in FIGS. 1 and 7B to 7D. Type-one dielectric film 120 may have a thickness of about 20 to 60 Å. Furthermore, like type-one dielectric film 120 of the intermediate structure illustrated in FIG. 7B, type-one dielectric film 120 of FIGS. 8B and 8C has a tetragonal crystalline structure. In the method illustrated in FIGS. 8A to 8D, during the formation of type-one dielectric film 120 on preliminary type-two dielectric film 132', an upper portion of preliminary type-two dielectric film 132' is crystallized to form a tetragonal crystalline structure at the upper portion of preliminary type-two dielectric film 132'. Preliminary type-two dielectric film 134' is then formed on an upper side of type-one dielectric film 120. The respective thicknesses of preliminary second dielectric films 132' and 134' may be the same or they may be in a range of about 1 to 20 Å. In addition, at least a portion of preliminary type-two dielectric film 134' grows along the tetragonal crystalline structure of type-one dielectric film 120 and thus has a tetragonal crystalline structure. That is, type-one dielectric film 120 and at least a portion of preliminary type-two dielectric film 132' may have a continuous tetragonal crystalline structure, and type-one dielectric film 120 and at least a portion of preliminary type-two dielectric film 134' may have a continuous tetragonal crystalline structure.

Figure 8D:
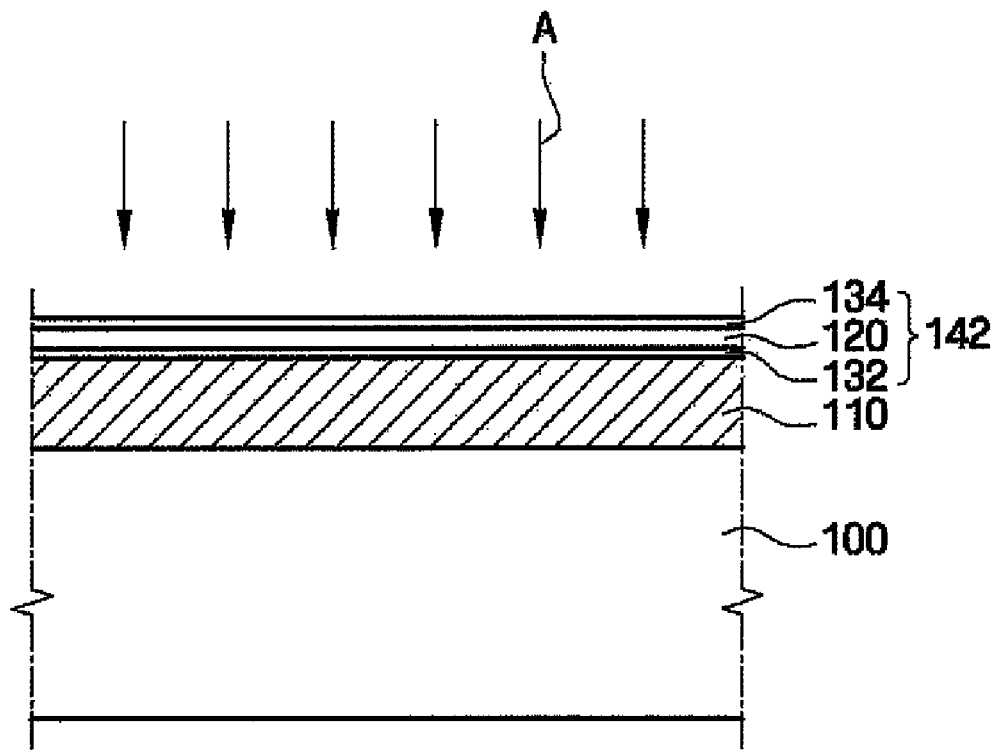

Next, referring to FIG. 8D, the resulting structure illustrated in FIG. 8C is subjected to heat treatment A. Heat treatment A is performed through the same procedure described above with reference to FIG. 7D, so a detailed description thereof will be omitted here. Heat treatment A is performed to crystallize preliminary type-two dielectric films 132' and 134' (heat treatment A readily crystallizes those films) to give them each a tetragonal crystalline structure and thereby complete type-two dielectric films 132 and 134. That is, type-two dielectric films 132 and 134 are formed from preliminary type-two dielectric films 132' and 134', respectively. Thereby, multilayer dielectric film 142 having a tetragonal crystalline structure and a three-layer structure comprising type-two dielectric film 132, type-one dielectric film 120, and type-two dielectric film 134 is formed. Therefore, multilayer dielectric film 142 having a three-layer structure that is crystallized to have a tetragonal crystalline structure may be denser, have a higher dielectric constant, have lower leakage current characteristics, and have better heat resistance than a zirconium oxide single film having a tetragonal crystalline structure or a multilayer dielectric film having another crystalline structure. Next, as shown in FIG. 3, second electrode 150 may be formed on multilayer dielectric film 142 to create a capacitor comprising first electrode 110, multilayer dielectric film 142, and second electrode 150.

Figure 9A:
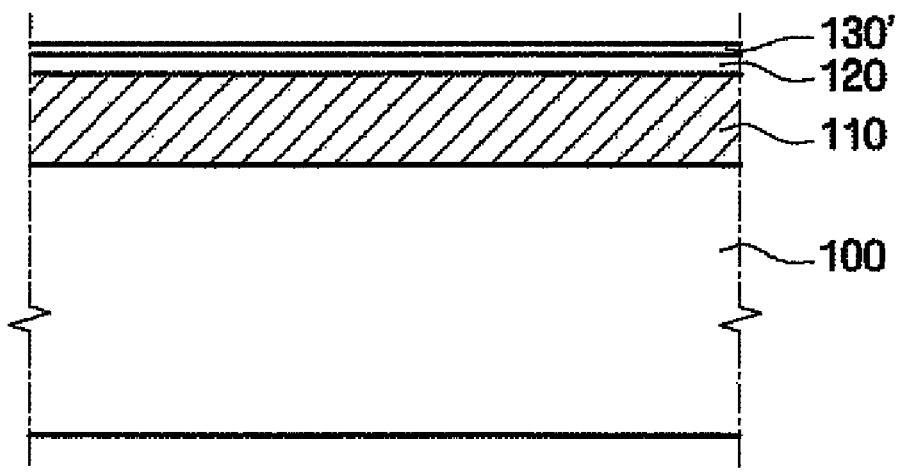
FIGS. 9A, 9B—inclusive of FIGS. 9B-1 and 9B-2, and 9C—inclusive of FIGS. 9C-1 and 9C-2 are cross-sectional views illustrating a method in accordance with an embodiment of the invention for fabricating the semiconductor device of FIG. 5.
Figures 1, 9B:
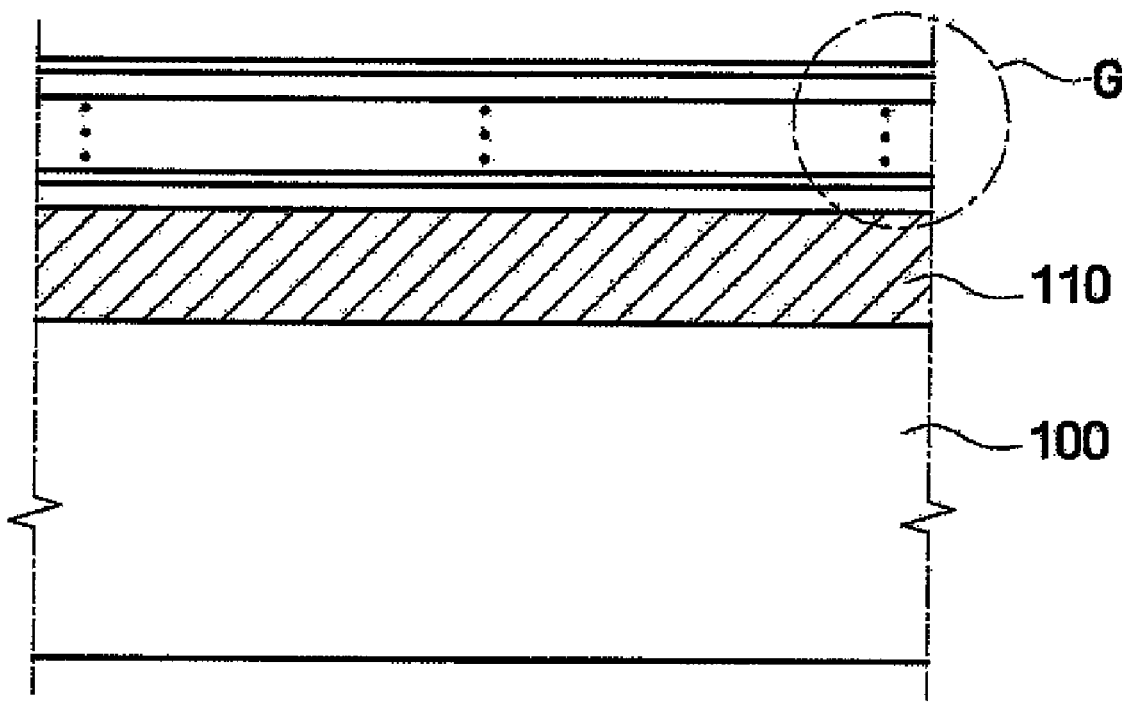
Figures 2, 9B:
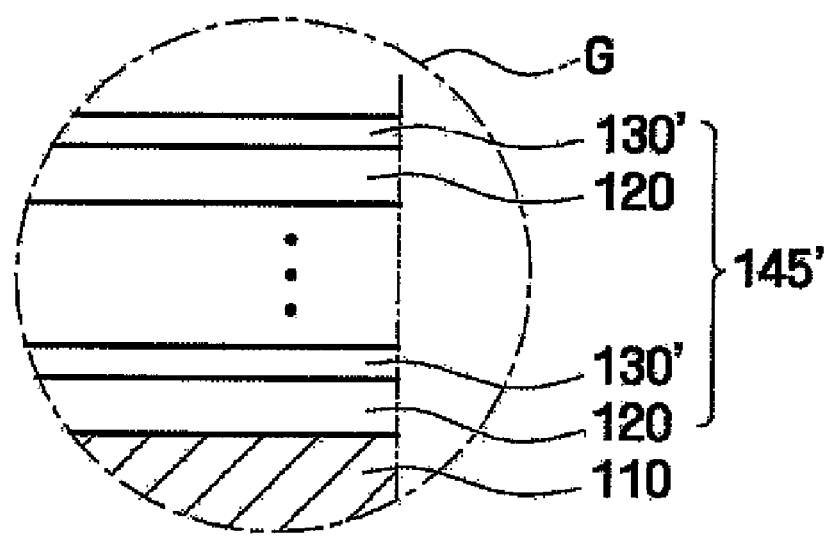
Figures 1, 9C:
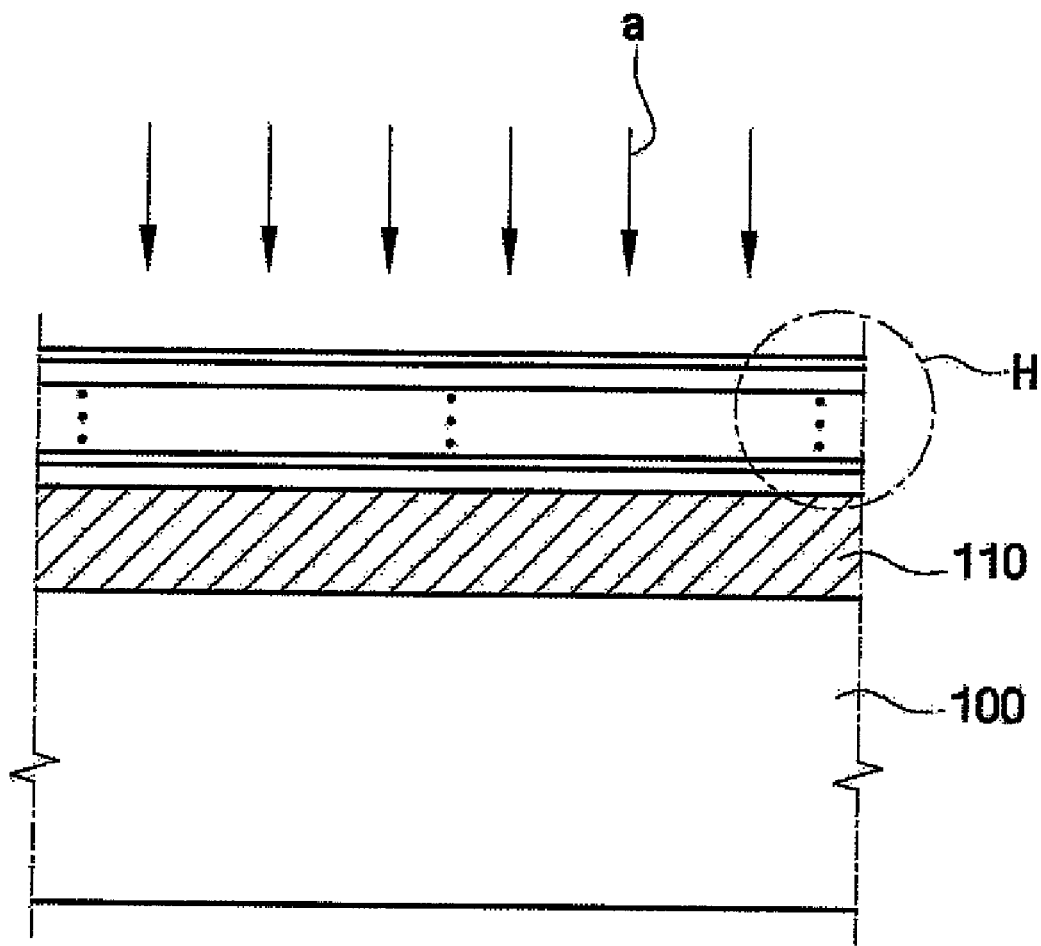
Figures 2, 9C:
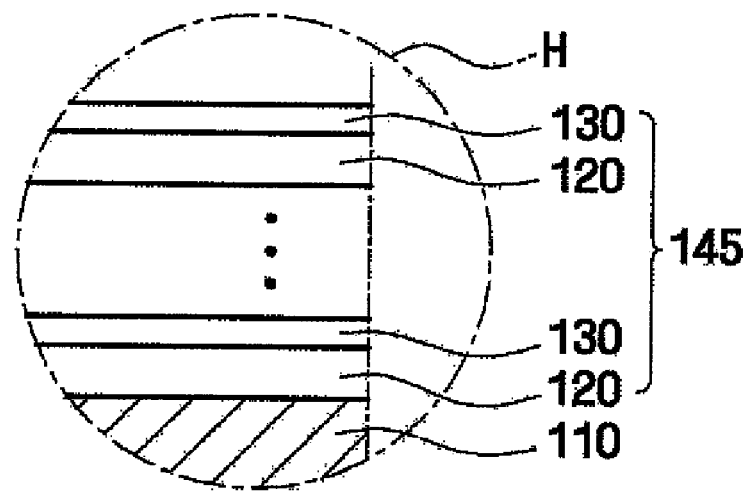

FIGS. 9A to 9C are cross-sectional views illustrating a method for fabricating the semiconductor device illustrated in FIG. 5 in accordance with an embodiment of the invention.

Referring to FIGS. 9A and 9B, a plurality of type-one dielectric films 120 and a plurality of preliminary type-two dielectric films 130' are alternately layered on first electrode 110 to form a multilayer dielectric film 145'. In the embodiment illustrated in FIGS. 9A and 9B, each type-one dielectric film 120 is formed from a zirconium oxide film and each preliminary type-two dielectric film 130' is formed of a hafnium oxide film. In the embodiment illustrated in FIGS. 9A to 9C, a type-one dielectric film 120 is formed on first electrode 110 first, and then a preliminary type-two dielectric film 130' is formed on first electrode 110. Alternatively, in another embodiment, a preliminary type-two dielectric film 130' may be formed on first electrode 110 first, and then a type-one dielectric film 120 may be formed on first electrode 110 (e.g., in a method for forming the semiconductor device illustrated in FIG. 6). In the embodiment illustrated in FIGS. 9A to 9C, the processes for forming type-one dielectric films 120 and preliminary type-two dielectric films 130' are substantially the same as the corresponding processes of embodiments described above, so description thereof will be omitted here. In addition, the greater the total number of type-one dielectric films 120 and preliminary type-two dielectric films 130' in multilayer dielectric film 145', the smaller the respective thicknesses of type-one dielectric films 120 and preliminary type-two dielectric films 130' may be. Each of first dielectric films 120 may have a thickness of about 2 to 20 Å, and each of preliminary second dielectric films 130' may have a thickness of about 1 to 10 Å.

Referring to FIG. 9C, the resulting structure illustrated in FIG. 9B is subjected to heat treatment A. Heat treatment A may be performed after multilayer dielectric film 145' is formed or while multilayer dielectric film 145' is being formed. In addition, heat treatment A may be performed after a subsequent process such as formation of second electrode 150. Thus, there are various stages in a method for forming the semiconductor device illustrated in FIG. 5 at which heat treatment A may be performed. As a result of heat treatment A, the plurality of preliminary type-two dielectric films 130' are crystallized and thereby given a tetragonal crystalline structure. The fabrication of a plurality of second dielectric films 130 is thereby finished. In this case, the crystallization of first dielectric films 120 is improved, and impurities are removed from inside of multilayer dielectric film 145. Multilayer dielectric film 145, which has a tetragonal crystalline structure and comprises a plurality of first dielectric films 120 and a plurality of second dielectric films 130 alternately disposed on first electrode 110, may be denser and more effectively reduce a leakage current than a zirconium oxide single film having a tetragonal crystalline structure or a multilayer dielectric film having another crystalline structure. Referring to FIG. 5, second electrode 150 may be formed on an upper side of multilayer dielectric film 145 to finish the fabrication of a capacitor comprising first electrode 100, multilayer dielectric film 145, and second electrode 150.

In the embodiments described above, each of the multilayer dielectric films is used in an MIM capacitor; however, a multilayer dielectric film having a tetragonal crystalline structure, in accordance with an embodiment of the invention, may also be used in other types of capacitors, such as PIP or MIP capacitors. In addition, a multilayer dielectric film in accordance with an embodiment of the invention may be used in any semiconductor device that may include a dielectric film having a relatively high dielectric constant and relatively low leakage current characteristics. Although not shown in the drawings, subsequent processes (i.e., processes performed after the formation of second electrode 150) such as the formation of metal wiring lines, passivation layers, and packaging may be performed through typical procedures to fabricate a semiconductor device. Detailed description of such subsequent processes will be omitted here.

Specific experimental examples related to embodiments of the invention will now be described. Since descriptions not given in this specification can be sufficiently analogized by those skilled in the art, such descriptions will be omitted here.

Experimental Example 1

Figure 10:
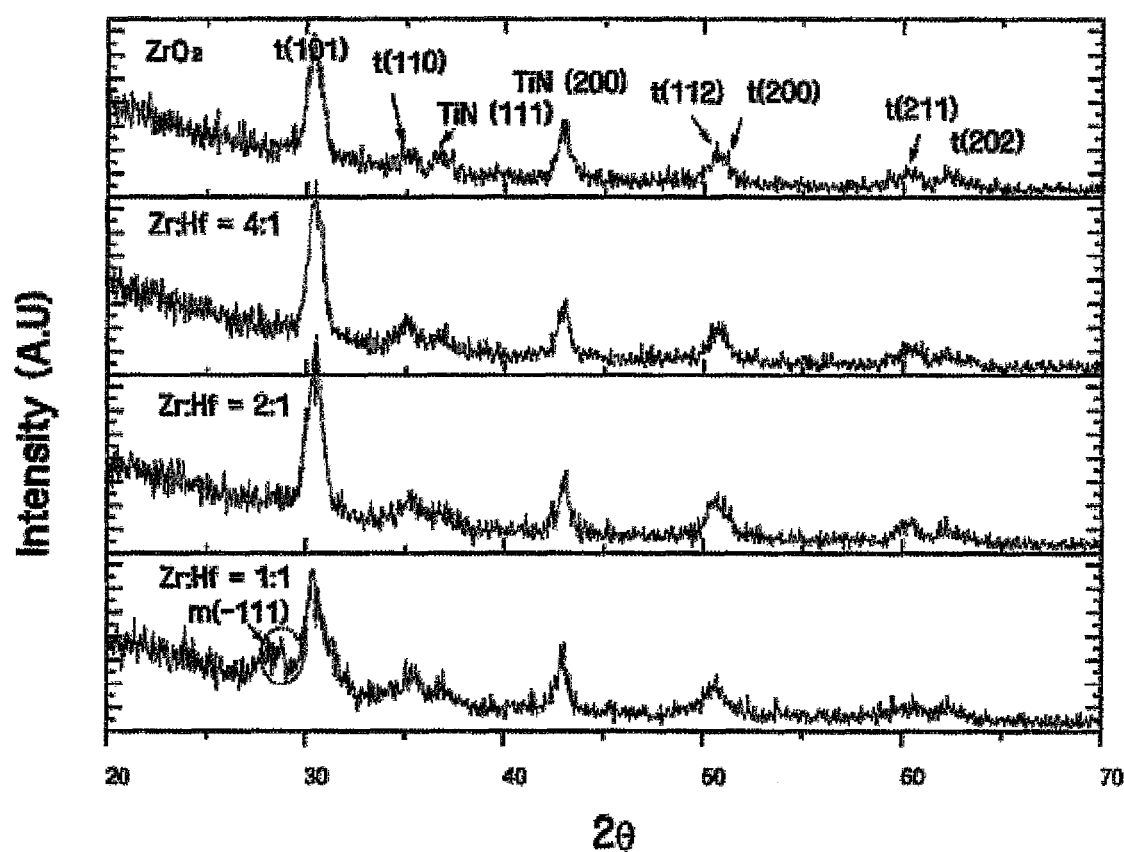
FIG. 10 illustrates XRD patterns of crystal structures of a zirconium oxide single film and a multilayer dielectric film in accordance with an embodiment of the invention.

FIG. 10 illustrates XRD patterns of a zirconium oxide single film and a multilayer dielectric film in accordance with an embodiment of the invention.

Referring to FIG. 10, the XRD pattern of the zirconium oxide single film is the same as the XRD pattern of the zirconium oxide single film having a tetragonal crystalline structure. The crystalline structure may be confirmed through analysis of peaks of the XRD pattern of the zirconium oxide single film using an X-ray diffractometer. In addition, when a thickness ratio of the zirconium oxide film and the hafnium oxide film was 2:1 or more, the XRD pattern of the multilayer dielectric film was the same as the XRD pattern of the zirconium oxide single film. When a thickness ratio of the zirconium oxide film and the hafnium oxide film was 1:1, an m(-111) peak was additionally found. In this case, the multilayer dielectric film does not have a tetragonal crystalline structure but a monoclinic crystalline structure. That is, in the case of when a thickness ratio of the zirconium oxide film and the hafnium oxide film is 2:1 or more, it can be seen that the multilayer dielectric film, which is formed from the zirconium oxide film and the hafnium oxide film, has a tetragonal crystalline structure.

Experimental Example 2

Figure 11A:
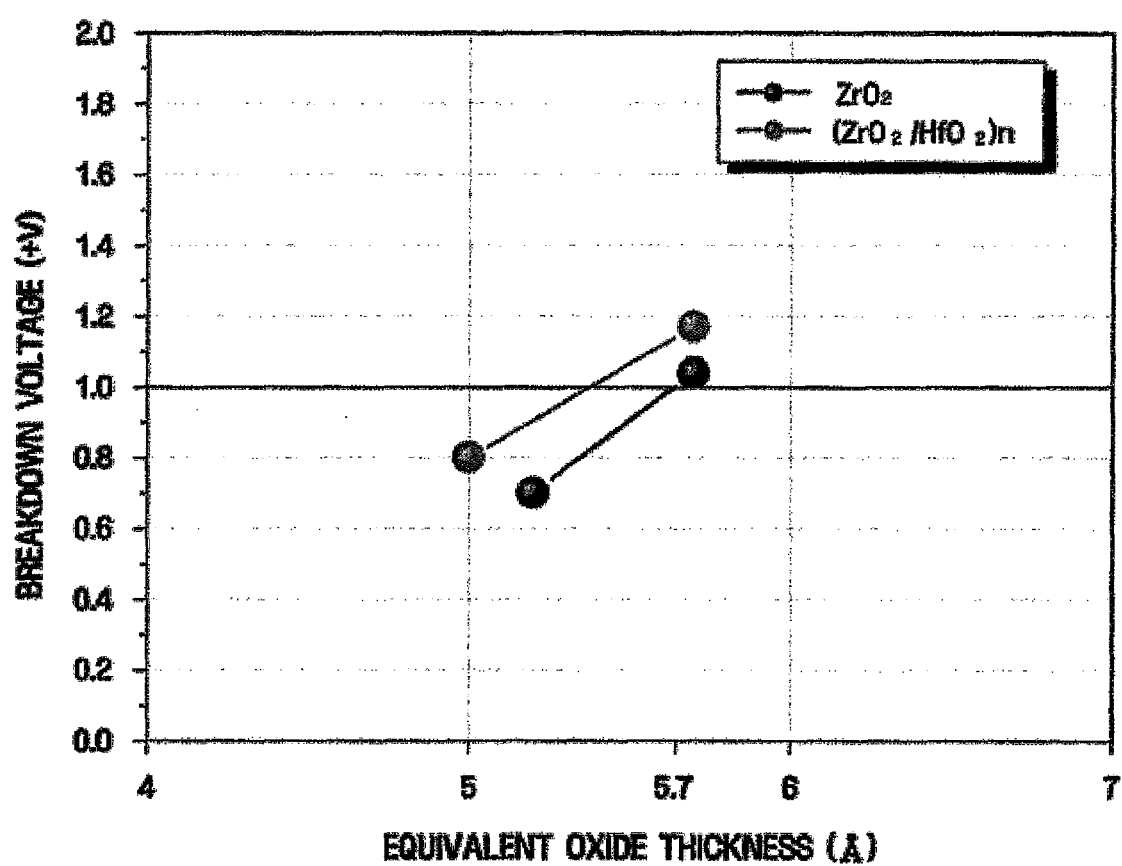

FIGS. 11A and 11B are graphs showing breakdown voltage (V) as a function of equivalent oxide thickness for a known zirconium oxide single film and a multilayer dielectric film in accordance with an embodiment of the invention.

Referring to the graph of FIG. 11A, the X-axis represents equivalent oxide thickness (Toxeq) of the zirconium oxide single film and the multilayer dielectric film, and the Y-axis represents a breakdown voltage (BV) when a leakage current of 1 fA per unit cell flows by application of a positive voltage. As shown in FIG. 11A, the zirconium oxide single film had a breakdown voltage of about 1.05 V and the multilayer dielectric film had a breakdown voltage of about 1.17 V with respect to the same equivalent oxide thickness of 5.7 Å. That is, the breakdown voltage of the multilayer dielectric film in accordance with an embodiment of the invention was about 0.12 V higher than the breakdown voltage of the single film with respect to the same equivalent oxide thickness. In other words, the breakdown voltage of the multilayer dielectric film gained about 0.12 V with respect to the same equivalent oxide thickness of 5.7 Å and the same leakage current of 1 fA. Therefore, it can be seen that the leakage current that is generated through the multilayer dielectric film is relatively lower with respect to the same equivalent oxide thickness.

Referring to the graph of FIG. 11B, the X-axis represents the equivalent oxide thickness of the zirconium oxide single film and the multilayer dielectric film, and the Y-axis represents a breakdown voltage (BV) when a leakage current of 1 fA per unit cell flows by application of a negative voltage. As shown in FIG. 11B, the zirconium oxide single film had a breakdown voltage of about −0.90 V and the multilayer dielectric film had a breakdown voltage of about −1.02 V with respect to the same equivalent oxide thickness of 5.7 Å. Analogous to the case where a positive voltage was applied, in the case where a negative voltage was applied, the breakdown voltage of the multilayer dielectric film was about 0.12 V lower than the breakdown voltage of the zirconium oxide single film with respect to the same equivalent oxide thickness. Therefore, it can be seen that the leakage current that is generated through the multilayer dielectric film is lower with respect to the same equivalent oxide thickness.

Experimental Example 3

Figure 12:
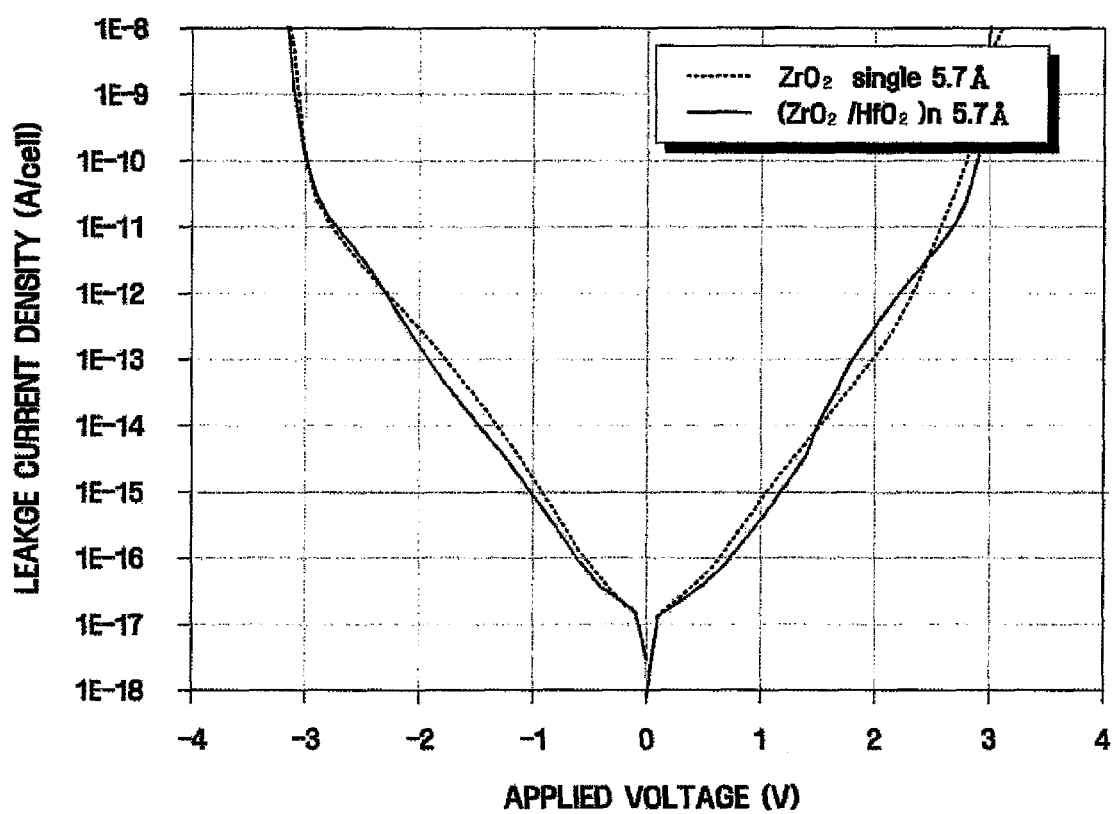
FIG. 12 is a graph showing leakage current density as a function of applied voltage for a known zirconium oxide single film and a multilayer dielectric film in accordance with an embodiment of the invention.

FIG. 12 is a graph showing leakage current density as a function of applied voltage for a known zirconium oxide single film and a multilayer dielectric film in accordance with an embodiment of the invention.

Referring to the graph of FIG. 12, the X-axis represents applied voltage, and the Y-axis represents leakage current density. Leakage current density is the amount of leakage current flowing per unit cell. In this example, the respective equivalent oxide thicknesses of the zirconium oxide single film and the multilayer dielectric film were each 5.7 Å. As shown in FIG. 12, when the leakage current density was 1 fA, the applied voltage of the zirconium oxide single film was 1.05 V/−0.90 V, and the applied voltage of the multilayer dielectric film was 1.17 V/−1.02 V. That is, the applied voltage of the multilayer dielectric film was greater than that of the zirconium oxide single film by about 0.12 V on the positive side and was less than that of the zirconium oxide single film by about 0.12 V on the negative side, with respect to the same leakage current density of 1 fA. So the results shown in FIG. 12 coincide with the test results shown in FIGS. 11A and 11B.

Through the above-mentioned experimental examples, it can be seen that the multilayer dielectric film in accordance with an embodiment of the invention has a tetragonal crystalline structure and has a significantly lower leakage current compared to the single dielectric film.

In a semiconductor device and a related fabrication method in accordance with embodiments of the invention, a hafnium oxide film having a tetragonal crystalline structure may be formed in conjunction with a zirconium oxide film that may be readily formed having a tetragonal crystalline structure through an atomic layer deposition process. Therefore, a multilayer dielectric film comprising a zirconium oxide film having a tetragonal crystalline structure and a hafnium oxide film having a tetragonal crystalline structure may be used in a semiconductor device as a dielectric film having an increased dielectric constant and improved heat resistance with respect to processes performed after the formation of the multilayer dielectric film, thereby reducing leakage current.

Although embodiments of the invention have been described herein, various modifications and changes may be made to the embodiments by one skilled in the art without departing from the scope of the invention as defined by the accompanying claims.

What is claimed is:

1. A method for fabricating a semiconductor device comprising a multilayer dielectric film disposed on a semiconductor substrate, the method comprising:
    forming a first type-one dielectric film over the semiconductor substrate, wherein the first type-one dielectric film comprises a first substance and has a tetragonal crystalline structure;
    forming a preliminary first type-two dielectric film over the semiconductor substrate, a first portion of the preliminary first type-two dielectric film having a tetragonal crystalline structure and a second portion of the preliminary first type-two dielectric film being amorphous; and
    heat treating the first type-one dielectric film and the preliminary first type-two dielectric film to convert the amorphous second portion of the preliminary first type-two dielectric to a tetragonal crystalline structure so as to form a first type-two dielectric film over the semiconductor substrate, wherein the first type-two dielectric film has a tetragonal crystalline structure and comprises a second substance different from the first substance,
    wherein the first type-two dielectric film has a greater dielectric constant than the first type-one dielectric film,
    wherein the multilayer dielectric film comprises the first type-one dielectric film and the first type-two dielectric film.

2. The method of claim 1, wherein:
    forming the preliminary first type-two dielectric film over the semiconductor substrate comprises forming the preliminary first type-two dielectric film on the first type-one dielectric film; and
    forming the preliminary first type-two dielectric film on the first type-one dielectric film comprises growing the first portion of the preliminary first type-two dielectric film from the tetragonal crystalline structure of the first type-one dielectric film.

3. The method of claim 1, wherein forming the first type-one dielectric film over the semiconductor substrate comprises forming the first type-one dielectric film on the preliminary first type-two dielectric film, wherein, while forming the first type-one dielectric film on the preliminary first type-two dielectric film, a tetragonal crystalline structure grows in the first portion of the preliminary first type-two dielectric film from the tetragonal crystalline structure of the first type-one dielectric film.

4. The method of claim 1, wherein heat treating the first type-one dielectric film and the preliminary first type-two dielectric film comprises performing rapid thermal annealing in an atmosphere comprising at least one of Ar and $O_2$ at a temperature of about 300 to 700° C. for about 30 sec to 5 min.

5. The method of claim 1, wherein heat treating the first type-one dielectric film and the preliminary first type-two dielectric film comprises:
    performing a plasma heat treatment process at a temperature of about 25 to 400° C. for about 5 to 60 min; or,
    performing a vacuum heat treatment process at a temperature of about 300 to 700° C.

6. The method of claim 1, wherein:
    the first type-one dielectric film is a zirconium oxide film; and
    the first type-two dielectric film is a hafnium oxide film.

7. The method of claim 1, wherein the first type-one dielectric film is thicker than the first type-two dielectric film.

8. The method of claim 1, wherein the first type-one dielectric film is formed using atomic layer deposition (ALD).

9. The method of claim 1, further comprising:
    forming a preliminary second type-two dielectric film over the semiconductor substrate,
    wherein heat treating the first type-one dielectric film and the preliminary first type-two dielectric film to form the first type-two dielectric film over the semiconductor substrate comprises heat treating the first type-one dielectric film, the preliminary first type-two dielectric film, and the preliminary second type-two dielectric film to form the first type-two dielectric film and a second type-two dielectric film over the semiconductor substrate, and
    wherein the multilayer dielectric film further comprises the second type-two dielectric film.

10. The method of claim 1, further comprising:
    forming a second type-one dielectric film on the preliminary first type-two dielectric film; and
    forming a preliminary second type-two dielectric film on the second type-one dielectric film, wherein forming the preliminary first type-two dielectric film over the semiconductor substrate comprises forming the preliminary first type-two dielectric film on the first type-one dielectric film, wherein heat treating the first type-one dielectric film and the preliminary first type-two dielectric film to form the first type-two dielectric film over the semiconductor substrate comprises heat treating the first type-one dielectric film, the preliminary first type-two dielectric film, the second type-one dielectric film, and the preliminary second type-two dielectric film to form the first type-two dielectric film from the preliminary first type-two dielectric film and to form a second type-two dielectric film from the preliminary second type-two dielectric film.

11. The method of claim 1, further comprising:

forming a preliminary second type-two dielectric film on the first type-one dielectric film; and forming a second type-one dielectric film on the preliminary second type-two dielectric film, wherein forming the first type-one dielectric film over the semiconductor substrate comprises forming the first type-one dielectric film on the preliminary first type-two dielectric film, and wherein heat treating the first type-one dielectric film and the preliminary first type-two dielectric film to form the first type-two dielectric film over the semiconductor substrate comprises heat treating the first type-one dielectric film, the preliminary first type-two dielectric film, the second type-one dielectric film, and the preliminary second type-two dielectric film to form the first type-two dielectric film from the preliminary first type-two dielectric film and to form the second type-two dielectric film from the preliminary second type-two dielectric film.

12. The method of claim 1, further comprising:

forming a first electrode on the semiconductor substrate; and, forming a second electrode on the multilayer dielectric film to form a capacitor comprising the first electrode, the second electrode, and the multilayer dielectric film, wherein the multilayer dielectric film is disposed on the first electrode.

* * * * *